US012233606B2

(12) United States Patent
Vidavsky et al.

(10) Patent No.: US 12,233,606 B2
(45) Date of Patent: *Feb. 25, 2025

(54) SUPPORT MATERIAL FORMULATION AND ADDITIVE MANUFACTURING PROCESSES EMPLOYING SAME

(71) Applicant: Stratasys Ltd., Rehovot (IL)

(72) Inventors: Yuval Vidavsky, Moshav Sitriya (IL); Dani Peri, Rehovot (IL); Mariana Pokrass, Rehovot (IL); Avraham Levy, Petach-Tikva (IL); Eynat Matzner, Adi (IL)

(73) Assignee: Stratasys Ltd., Rehovot (IL)

( * ) Notice: Subject to any disclaimer, the term of this patent is extended or adjusted under 35 U.S.C. 154(b) by 0 days.

This patent is subject to a terminal disclaimer.

(21) Appl. No.: 18/520,708

(22) Filed: Nov. 28, 2023

(65) Prior Publication Data
US 2024/0092033 A1 Mar. 21, 2024

Related U.S. Application Data

(63) Continuation of application No. 17/542,549, filed on Dec. 6, 2021, now Pat. No. 11,850,802, which is a
(Continued)

(51) Int. Cl.
*B29C 64/40* (2017.01)
*B29C 35/08* (2006.01)
(Continued)

(52) U.S. Cl.
CPC ............ *B29C 64/40* (2017.08); *B29C 64/112* (2017.08); *B29C 64/35* (2017.08); *B33Y 10/00* (2014.12);
(Continued)

(58) Field of Classification Search
CPC ....... B29C 64/40; B29C 64/112; B29C 64/35; B29C 35/08; B33Y 10/00; B33Y 40/00;
(Continued)

(56) References Cited

U.S. PATENT DOCUMENTS 2,303,398 A   12/1942   Schwartz et al.
3,870,560 A   3/1975    Shumaker
(Continued)

FOREIGN PATENT DOCUMENTS

CN   1347363     5/2002
CN   101027170   8/2007
(Continued)

OTHER PUBLICATIONS

Advisory Action Dated Jun. 16, 2021 from the US Patent and Trademark Office Re. U.S. Appl. No. 15/752,621. (11 pages).
(Continued)

*Primary Examiner* — Shane Fang

(57) ABSTRACT

Novel support material formulations, characterized as providing a cured support material with improved dissolution rate, while maintaining sufficient mechanical strength, are disclosed. The formulations comprise a water-miscible non-curable polymer, a first water-miscible, curable material and a second, water-miscible material that is selected capable of interfering with intermolecular interactions between polymeric chains formed upon exposing the first water-miscible material to curing energy. Methods of fabricating a three-dimensional object, and a three-dimensional object fabricated thereby are also disclosed.

18 Claims, 4 Drawing Sheets

Black column with the addition of 10% Hydroxylated acryl amide

Related U.S. Application Data continuation of application No. 15/752,621, filed as application No. PCT/IL2016/050886 on Aug. 14, 2016, now Pat. No. 11,207,839.

(60) Provisional application No. 62/205,009, filed on Aug. 14, 2015, provisional application No. 62/205,010, filed on Aug. 14, 2015.

(51) Int. Cl.

| | | |
|---|---|---|
| *B29C 64/112* | (2017.01) | |
| *B29C 64/35* | (2017.01) | |
| *B29K 33/04* | (2006.01) | |
| *B33Y 10/00* | (2015.01) | |
| *B33Y 40/20* | (2020.01) | |
| *B33Y 70/00* | (2020.01) | |
| *B33Y 80/00* | (2015.01) | |
| *C08F 2/48* | (2006.01) | |
| *C08F 220/28* | (2006.01) | |
| *C08F 283/06* | (2006.01) | |
| *C11D 3/04* | (2006.01) | |
| *C11D 3/08* | (2006.01) | |
| *C11D 7/06* | (2006.01) | |
| *C11D 7/14* | (2006.01) | |
| *G03F 7/00* | (2006.01) | |
| *G03F 7/027* | (2006.01) | |
| *G03G 9/087* | (2006.01) | |

(52) U.S. Cl.
CPC ............... *B33Y 40/20* (2020.01); *B33Y 70/00* (2014.12); *C08F 2/48* (2013.01); *C08F 220/28* (2013.01); *C08F 220/286* (2020.02); *C08F 283/06* (2013.01); *C11D 3/044* (2013.01); *C11D 3/08* (2013.01); *C11D 7/06* (2013.01); *C11D 7/14* (2013.01); *G03G 9/08722* (2013.01); *G03G 9/08728* (2013.01); *G03G 9/08793* (2013.01); *G03G 9/08795* (2013.01); *B29C 35/08* (2013.01); *B29K 2033/04* (2013.01); *B33Y 80/00* (2014.12); *G03F 7/0037* (2013.01); *G03F 7/027* (2013.01)

(58) Field of Classification Search
CPC ........... B33Y 70/00; B33Y 80/00; C08F 2/48; C08F 220/28; C08F 283/06; C11D 7/06; C11D 7/14; G03G 9/08722; G03G 9/08728; G03G 9/08793; G03G 9/08795; B29K 2033/04; G03F 7/0037; G03F 7/027
See application file for complete search history.

(56) References Cited

U.S. PATENT DOCUMENTS

| | | | |
|---|---|---|---|
| 4,048,121 | A | 9/1977 | Chang |
| 4,093,566 | A | 6/1978 | MacNamara et al. |
| 4,259,434 | A | 3/1981 | Yamasue et al. |
| 4,457,322 | A | 7/1984 | Rubin et al. |
| 4,751,023 | A | 6/1988 | Stehlin et al. |
| 5,234,505 | A | 8/1993 | Winston et al. |
| 5,378,242 | A | 1/1995 | Christie et al. |
| 6,228,923 | B1 | 5/2001 | Lombardi et al. |
| 7,300,619 | B2 | 11/2007 | Napadensky et al. |
| 7,479,510 | B2 | 1/2009 | Napadensky et al. |
| 9,126,365 | B1 | 9/2015 | Mark et al. |
| 9,334,402 | B2 | 5/2016 | Napadensky |
| 2003/0207959 | A1 | 11/2003 | Napadensky et al. |
| 2005/0245420 | A1 | 11/2005 | Lewis et al. |
| 2009/0250835 | A1 | 10/2009 | Takase et al. |
| 2011/0079936 | A1 | 4/2011 | Oxman |
| 2012/0178845 | A1 | 7/2012 | Napadensky et al. |
| 2015/0018262 | A1 | 1/2015 | Massad et al. |
| 2016/0096324 | A1 | 4/2016 | Giller |
| 2017/0001382 | A1 | 1/2017 | Stepper et al. |
| 2017/0252971 | A1 | 9/2017 | Umebayashi |
| 2018/0230246 | A1 | 8/2018 | Vidavsky et al. |
| 2018/0236717 | A1 | 8/2018 | Pokrass |
| 2022/0088884 | A1 | 3/2022 | Vidavsky et al. |

FOREIGN PATENT DOCUMENTS

| | | |
|---|---|---|
| CN | 103180125 | 6/2013 |
| CN | 103189187 | 7/2013 |
| CN | 103347682 | 10/2013 |
| EP | 1160312 | 12/2001 |
| EP | 2067594 | 6/2009 |
| EP | 2636511 | 9/2013 |
| EP | 3235630 | 10/2017 |
| EP | 3254835 | 12/2017 |
| JP | 57-007427 | 2/1982 |
| JP | 10-264362 | 10/1998 |
| JP | 2007-291317 | 11/2007 |
| JP | 2008-507619 | 3/2008 |
| JP | 2011-005658 | 1/2011 |
| JP | 2014-083744 | 5/2014 |
| JP | 2015-117276 | 6/2015 |
| JP | 2015-123684 | 7/2015 |
| JP | 2015-183103 | 10/2015 |
| WO | WO 95/35359 | 12/1995 |
| WO | WO 00/62994 | 10/2000 |
| WO | WO 2006/020279 | 2/2006 |
| WO | WO 2008/038540 | 3/2008 |
| WO | WO 2012/060204 | 5/2012 |
| WO | WO 2015/049873 | 4/2015 |
| WO | WO 2016/098636 | 6/2016 |
| WO | WO 2017/029657 | 2/2017 |
| WO | WO 2017/029658 | 2/2017 |

OTHER PUBLICATIONS

Communication Pursuant to Article 94(3) EPC Dated Feb. 28, 2022 From the European Patent Office Re. Application No. 16836744.9. (8 Pages).
English Summary Dated Mar. 27, 2023 of Notification of Office Action and Search Report Dated Dated Mar. 10, 2023 From the State Intellectual Property Office of the People's Republic of China Re. Application No. 202110658598.3 (2 pages).
European Search Report and the European Search Opinion Dated Jul. 15, 2022 From the European Patent Office Re. Application No. 22166419.6. (7 Pages).
Final Official Action Dated Mar. 10, 2021 From the US Patent and Trademark Office Re. U.S. Appl. No. 15/752,621. (14 Pages).
Final Official Action Dated Mar. 26, 2021 from the US Patent and Trademark Office Re. U.S. Appl. No. 15/752,300. (26 pages).
International Preliminary Report on Patentability Dated Mar. 1, 2018 From the International Bureau of WIPO Re. Application No. PCT/IL2016/050886. (9 Pages).
International Preliminary Report on Patentability Dated Mar. 1, 2018 From the International Bureau of WIPO Re. Application No. PCT/IL2016/050887. (8 Pages).
International Search Report and the Written Opinion Dated Nov. 14, 2016 From the International Searching Authority Re. Application No. PCT/IL2016/050886. (11 Pages).
International Search Report and the Written Opinion Dated Nov. 14, 2016 From the International Searching Authority Re. Application No. PCT/IL2016/050887. (11 Pages).
Notice of Allowance Dated Aug. 11, 2021 from the US Patent and Trademark Office Re. U.S. Appl. No. 15/752,621. (12 pages).
Notice of Allowance Dated Jul. 14, 2021 together with Interview Summary from the US Patent and Trademark Office Re. U.S. Appl. No. 15/752,300. (16 pages).
Notice of Allowance Dated Aug. 17, 2023 from the US Patent and Trademark Office Re. U.S. Appl. No. 17/542,549. (22 pages).
Notice of Reason for Rejection Dated Mar. 10, 2020 From the Japan Patent Office Re. Application No. 2017-567347 and Its Translation Into English. (9 Pages).

(56) References Cited

OTHER PUBLICATIONS

Notice of Reason for Rejection Dated Oct. 16, 2020 From the Japan Patent Office Re. Application No. 2017-567347 and Its Translation Into English. 8 Pages).
Notice of Reason(s) for Rejection Dated Jun. 25, 2021 From the Japan Patent Office Re. Application No. 2018-500768 and Its Translation Into English. (7 Pages).
Notice of Reason(s) for Rejection Dated Nov. 29, 2022 From the Japan Patent Office Re. Application No. 2022-22209 and Its Translation Into English.(8 pages).
Notice of Reasons for Rejection Dated Aug. 21, 2020 From the Japan Patent Office Re. Application No. 2018-500768 and Its Translation Into English. (18 Pages).
Notification of Office Action and Search Report Dated Aug. 5, 2019 From the State Intellectual Property Office of the People's Republic of China Re. Application No. 201680059093.2. (6 Pages).
Notification of Office Action and Search Report Dated Mar. 10, 2023 From the State Intellectual Property Office of the People's Republic of China Re. Application No. 202110658598.3. (8 Pages).
Notification of Office Action and Search Report Dated Sep. 11, 2020 From the State Intellectual Property Office of the People's Republic of China Re. Application No. 201680059093.2. (7 Pages).
Notification of Office Action and Search Report Dated Aug. 12, 2020 From the State Intellectual Property Office of the People's Republic of China Re. Application No. 201680048027 .5. (5 Pages).
Notification of Office Action and Search Report Dated Aug. 17, 2022 From the State Intellectual Property Office of the People's Republic of China Re. Application No. 202110658598.3. (7 Pages).
Notification of Office Action and Search Report Dated Dec. 22, 2020 From the State Intellectual Property Office of the People's Republic of China Re. Application No. 201680048027 .5 and Its Translation of Office Action Into English. (11 Pages).
Notification of Office Action and Search Report Dated Apr. 28, 2019 From the State Intellectual Property Office of the People's Republic of China Re. Application No. 201680048027 .5. (6 Pages).
Notification of Office Action Dated Mar. 20, 2020 From the State Intellectual Property Office of the People's Republic of China Re. Application No. 201680059093.2. (3 Pages).
Notification of Office Action Dated Feb. 26, 2020 From the State Intellectual Property Office of the People's Republic of China Re. Application No. 201680048027.5 and Its Translation Into English. (12 Pages).
Office Action Dated Apr. 7, 2021 From the Israel Patent Office Re. Application No. 257511 and Its Translation Into English. (7 Pages).
Office Action Dated Oct. 31, 2019 From the Israel Patent Office Re. Application No. 257510 and Its Translation Into English. (5 Pages).
Official Action Dated May 8, 2023 from the US Patent and Trademark Office Re. U.S. Appl. No. 17/542,549. (23 pages).
Official Action Dated Sep. 21, 2020 from the US Patent and Trademark Office Re. U.S. Appl. No. 15/752,300. (34 pages).
Official Action Dated Nov. 30, 2020 From the US Patent and Trademark Office Re. U.S. Appl. No. 15/752,621. (37 Pages).
Restriction Official Action Dated Mar. 9, 2020 From the US Patent and Trademark Office Re. U.S. Appl. No. 15/752,621. (7 Pages).
Restriction Official Action Dated Apr. 1, 2020 from the US Patent and Trademark Office Re. U.S. Appl. No. 15/752,300. (8 pages).
Restriction Official Action Dated Jan. 11, 2023 from the US Patent and Trademark Office Re. U.S. Appl. No. 17/542,549. (7 pages).
Restriction Official Action Dated Sep. 17, 2020 from the US Patent and Trademark Office Re. U.S. Appl. No. 15/752,621. (10 pages).
Supplementary European Search Report and the European Search Opinion Dated Apr. 8, 2019 From the European Patent Office Re. Application No. 16836743.1. (6 Pages).
Supplementary European Search Report and the European Search Opinion Dated May 10, 2019 From the European Patent Office Re. Application No. 16836744.9. (12 Pages).
Supplementary Partial European Search and the European Provisional Opinion Dated Feb. 5, 2019 From the European Patent Office Re. Application No. 16836744.9. (15 Pages).
Translation Dated Sep. 4, 2020 of Notification of Office Action Dated Aug. 12, 2020 From the State Intellectual Property Office of the People's Republic of China Re. Application No. 201680048027 .5. (2 Pages).
Translation Dated Sep. 7, 2022 of Notification of Office Action Dated Aug. 17, 2022 From the State Intellectual Property Office of the People's Republic of China Re. Application No. 202110658598.3. (3 Pages).
Translation Dated Apr. 10, 2020 of Notification of Office Action Dated Mar. 20, 2020 From the State Intellectual Property Office of the People's Republic of China Re. Application No. 201680059093.2. (3 Pages).
Translation Dated Oct. 20, 2020 of Notification of Office Action Dated Sep. 11, 2020 From the State Intellectual Property Office of the People's Republic of China Re. Application No. 201680059093.2. (11 Pages).
Translation Dated Sep. 24, 2019 of Notification of Office Action Dated Aug. 5, 2019 From the State Intellectual Property Office of the People's Republic of China Re. Application No. 201680059093.2. (4 Pages).
Translation Dated May 26, 2019 of Notification of Office Action Dated Apr. 28, 2019 From the State Intellectual Property Office of the People's Republic of China Re. Application No. 201680048027 .5. (6 Pages).

Black column with the addition of 10% Hydroxylated acryl amide

Black column with the addition of 10% Hydroxylated acryl amide

Support removal time for different weight percentage of PEG Acrylate Mixture and Hydroxylated acryl amide (HAA)

Black column with the addition of 10% Hydroxylated acryl amide
Blank column with the addition of 5% Hydroxylated acryl amide and 5% DMAPAA Black column with the addition of 10% Hydroxylated acryl amide
Blank column with the addition of 5% Hydroxylated acryl amide and 5% dialkilamino substituted acrylamide HAA Hydroxylated acryl amide
IBOA isobornyl acrylate

SUPPORT MATERIAL FORMULATION AND ADDITIVE MANUFACTURING PROCESSES EMPLOYING SAME

RELATED APPLICATIONS

This application is a continuation of U.S. patent application Ser. No. 17/542,549 filed on Dec. 6, 2021, which is a continuation of U.S. patent application Ser. No. 15/752,621 filed on Feb. 14, 2018, now U.S. Pat. No. 11,207,839, which is a National Phase of PCT Patent Application No. PCT/IL2016/050886 having International Filing Date of Aug. 14, 2016, which claims the benefit of priority under 35 USC § 119(e) of U.S. Provisional Patent Application Nos. 62/205,010 and 62/205,009, both filed on Aug. 14, 2015. The contents of the above applications are all incorporated by reference as if fully set forth herein in their entirety.

FIELD AND BACKGROUND OF THE INVENTION

The present invention, in some embodiments thereof, relates to additive manufacturing (AM), and more particularly, but not exclusively, to formulations useful for forming a support material in additive manufacturing such as three-dimensional inkjet printing, and to methods of additive manufacturing utilizing same.

Additive manufacturing (AM) is a technology enabling fabrication of arbitrarily shaped structures directly from computer data via additive formation steps (additive manufacturing; AM). The basic operation of any AM system consists of slicing a three-dimensional computer model into thin cross sections, translating the result into two-dimensional position data and feeding the data to control equipment which fabricates a three-dimensional structure in a layerwise manner.

Additive manufacturing entails many different approaches to the method of fabrication, including three-dimensional printing such as 3D inkjet printing, electron beam melting, stereolithography, selective laser sintering, laminated object manufacturing, fused deposition modeling and others.

Three-dimensional (3D) printing processes, for example, 3D inkjet printing, are being performed by a layer by layer inkjet deposition of building materials. Thus, a building material is dispensed from a dispensing head having a set of nozzles to deposit layers on a supporting structure. Depending on the building material, the layers may then be cured or solidified using a suitable device.

Various three-dimensional printing techniques exist and are disclosed in, e.g., U.S. Pat. Nos. 6,259,962, 6,569,373, 6,658,314, 6,850,334, 6,863,859, 7,183,335, 7,209,797, 7,225,045, 7,300,619, and 7,500,846 and U.S. Patent Application having Publication No. 20130073068, all by the same Assignee.

During the additive manufacturing (AM) process, the building material may include "model material" (also known as "object material" or "modeling material"), which is deposited to produce the desired object, and frequently, another material ("support material" or "supporting material") is used to provide temporary support to the object as it is being built. The other material is referred to herein and in the art as "support material" or "supporting material", and is used to support specific areas of the object during building and for assuring adequate vertical placement of subsequent object layers. For example, in cases where objects include overhanging features or shapes, e.g. curved geometries, negative angles, voids, and the like, objects are typically constructed using adjacent support constructions, which are used during the printing and then subsequently removed in order to reveal the final shape of the fabricated object.

The modeling material and the supporting material may be initially liquid and subsequently hardened to form the required layer shape. The hardening process may be performed by a variety of methods, such as UV curing, phase change, crystallization, drying, etc. In all cases, the support material is deposited in proximity of the modeling material, enabling the formation of complex object geometries and filling of object voids. In such cases, the removal of the hardened support material is liable to be difficult and time consuming, and may damage the formed object.

When using currently available commercial print heads, such as ink-jet printing heads, the support material should have a relatively low viscosity (about 10-20 cPs) at the working, i.e., jetting, temperature, such that it can be jetted. Further, the support material should harden rapidly in order to allow building of subsequent layers. Additionally, the hardened support material should have sufficient mechanical strength for holding the model material in place, and low distortion for avoiding geometrical defects.

Examples of materials that can be used as supporting materials are phase change materials, with wax being a non-limiting example. At an appropriately high temperature these materials melt and thus permit support removal when in the liquid state. One of the drawbacks of such phase change is that the temperature required for melting the supporting material may also cause deformation of the model, and hence of the object structure.

Known methods for removal of support materials include mechanical impact (applied by a tool or water-jet), as well as chemical methods, such as dissolution in a solvent, with or without heating. The mechanical methods are labor intensive and are often unsuited for small intricate parts.

For dissolving the support materials, the fabricated object is often immersed in water or in a solvent that is capable of dissolving the support materials. The solutions utilized for dissolving the support material are also referred to herein and in the art as "cleaning solutions". In many cases, however, the support removal process may involve hazardous materials, manual labor and/or special equipment requiring trained personnel, protective clothing and expensive waste disposal. In addition, the dissolution process is usually limited by diffusion kinetics and may require very long periods of time, especially when the support constructions are large and bulky. Furthermore, post-processing may be necessary to remove traces of a 'mix layer' on object surfaces. The term "mix layer" refers to a residual layer of mixed hardened model and support materials formed at the interface between the two materials on the surfaces of the object being fabricated, by model and support materials mixing into each other at the interface between them.

Additionally, methods requiring high temperatures during support removal may be problematic since there are model materials that are temperature-sensitive, such as waxes and certain flexible materials. Both mechanical and dissolution methods for removal of support materials are especially problematic for use in an office environment, where ease-of-use, cleanliness and environmental safety are major considerations.

Water-soluble materials for 3D building have been previously described. For example, U.S. Pat. No. 6,228,923 describes a water soluble thermoplastic polymer—Poly(2-ethyl-2-oxazoline)—for use as a support material in a 3D building process involving high pressure and high temperature extrusion of ribbons of selected materials onto a plate.

A water-containing support material comprising a fusible crystal hydrate is described in U.S. Pat. No. 7,255,825. Fusible crystal hydrates undergo a phase change from solid to liquid (i.e. melt) usually at higher than ambient temperature (typically between 20° C. and 120° C. depending upon the substance). Typically, upon melting, fusible crystal hydrates turn into aqueous solutions of the salts from which they are formed. The water content in these solutions is typically high enough to make the solutions suitable for jetting from a thermal ink-jet printhead. The melting process is reversible and material dispensed in a liquid state readily solidifies upon cooling.

Compositions suitable for support in building a 3D object are described, for example, in U.S. Pat. Nos. 7,479,510, 7,183,335 and 6,569,373, all to the present Assignee. Generally, the compositions disclosed in these patents comprise at least one UV curable (reactive) component, e.g., an acrylic component, at least one non-UV curable component, e.g. a polyol or glycol component, and a photoinitiator. After irradiation, these compositions provide a semi-solid or gel-like material capable of dissolving or swelling upon exposure to water, to an alkaline or acidic solution or to a water detergent solution. 3D printing methodologies using such a soluble support material are also known as "Soluble Support Technology" or SST, and the support material formulation is often referred to a "soluble support material" or "soluble support material formulation". Soluble support materials should beneficially feature sufficient water solubility, so as to be removed during a relatively short time period, or sufficient solubility in a non-hazardous cleaning solution, yet, at the same, to exhibit mechanical properties sufficient to support the printed object during the additive manufacturing process.

Besides swelling, another characteristic of such a support material may be the ability to break down during exposure to water, to an alkaline or acidic solution or to a water detergent solution because the support material is made of hydrophilic components. During the swelling process, internal forces cause fractures and breakdown of the cured support. In addition, the support material can contain a substance that liberates bubbles upon exposure to water, e.g. sodium bicarbonate, which transforms into $CO_2$ when in contact with an acidic solution. The bubbles aid in the process of removal of support from the model.

Additional Background art includes U.S. Patent Application having Publication No. 2003/0207959.

SUMMARY OF THE INVENTION

There is an unmet need for improved support materials in 3D inkjet printing.

The present inventors have now designed and successfully practiced novel soluble support material formulations, which supersede currently known support material formulations. The hardened (e.g., cured) support material obtained upon dispensing and curing these formulations can easily and efficiently be removed by contacting an alkaline solution, with reduced dissolution time and increased dissolution rate, while not compromising the mechanical properties of the support material.

The support material formulations described herein include, in addition to curable (reactive) components, and polymeric non-curable components, as described herein, also a curable component that reduces a degree of cross-linking in the cured support material, or otherwise interferes with intermolecular interactions between the cured polymeric components formed upon curing a support material formulation. The additional curable component attributes to decreased dissolution time of the cured support material, without compromising the mechanical properties of the support material.

According to an aspect of some embodiments of the present invention there is provided a support material formulation comprising:

a non-curable water-miscible polymer;

a first water-miscible, curable material; and at least one second water-miscible curable material, wherein the second curable material is selected capable of interfering with intermolecular interactions between polymeric chains formed upon exposing the first water-miscible material to curing energy.

According to some of any of the embodiments described herein, the second curable material is selected capable of forming hydrogen bonds with the polymeric chains formed upon exposing the first water-soluble material to the curing energy.

According to some of any of the embodiments described herein, the first curable material comprises a mixture of a mono-functional curable material and a multi-functional (e.g., di-functional) curable material.

According to some of any of the embodiments described herein, the second curable material is capable of interfering with a chemical cross-linking between the polymeric chains, the chemical cross-linking being imparted by the multi-functional (e.g., di-functional) curable material.

According to some of any of the embodiments described herein, the second curable material is capable of reducing a degree of a chemical cross-linking between the polymeric chains, the chemical cross-linking being imparted by the multi-functional (e.g., di-functional) curable material.

According to some of any of the embodiments described herein, the second curable material is capable of forming hydrogen bonds with the polymeric chains.

According to some of any of the embodiments described herein, the second curable material features at least two hydrogen bond-forming chemical moieties.

According to some of any of the embodiments described herein, each of the at least two hydrogen bond-forming chemical moieties independently comprises at least one atom selected from oxygen and nitrogen.

According to some of any of the embodiments described herein, each of the at least two hydrogen bond-forming chemical moieties is independently selected from amide, carboxylate, hydroxy, alkoxy, aryloxy, ether, amine, carbamate, hydrazine, a nitrogen-containing heteralicyclic, and an oxygen-containing heteralicyclic.

According to some of any of the embodiments described herein, at least two of the hydrogen bond-forming chemical moieties are separated by 2-10, or by 2-8, or by 2-6 atoms (e.g., carbon atoms).

According to some of any of the embodiments described herein, each of the first and second curable materials is a UV-curable material.

According to some of any of the embodiments described herein, each of the first and second curable materials independently comprises an acrylate, a methacrylate, an acrylamide or a methacrylamide curable moiety.

According to some of any of the embodiments described herein, the first curable material comprises a poly(alkylene glycol) acrylate.

According to some of any of the embodiments described herein, the first curable material comprises a mono-functional poly(alkylene glycol) acrylate.

According to some of any of the embodiments described herein, the first curable material comprises a mixture of a mono-functional poly(alkylene glycol) acrylate and a multi-functional, e.g., di-functional, poly(alkylene glycol) acrylate.

According to some of any of the embodiments described herein, the first curable material comprises a mixture of a poly(alkylene glycol) acrylate and a poly(alkylene glycol) diacrylate.

According to some of any of the embodiments described herein, a weight ratio between the mono-functional poly(alkylene glycol) acrylate and the multi-functional (e.g., di-functional) poly(alkylene glycol) acrylate (e.g., poly(alkylene glycol) diacrylate) in the first curable material ranges from 70:30 to 95:5.

According to some of any of the embodiments described herein, the second curable material is selected from an acrylate, a methacrylate, an acrylamide or a methacrylamide.

According to some of any of the embodiments described herein, the second curable material is represented by Formula I:

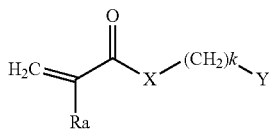

Formula I wherein:

Ra is selected from H, C(1-4)alkyl and a hydrophilic group;

k is an integer ranging from 2 to 10, or from 2 to 8, or from 2 to 6, or from 2 to 4, or is 2 or 3; and X and Y are each independently a hydrogen bond-forming moiety that comprises at least one nitrogen and/or oxygen atom.

According to some of any of the embodiments described herein, Y is selected from hydroxyl, alkoxy, aryloxy, amine, alkylamine, dialkylamine, carboxylate, hydrazine, carbamate, hydrazine, a nitrogen-containing heteralicyclic, and an oxygen-containing heteralicyclic.

According to some of any of the embodiments described herein, X is —O—.

According to some of any of the embodiments described herein, Ra is H, such that the second curable material is an acrylate.

According to some of any of the embodiments described herein, X is —NRc-, wherein Rc is hydrogen, alkyl, cycloalkyl or aryl.

According to some of any of the embodiments described herein, Ra is H, such that the second curable material is an acrylamide.

According to some of any of the embodiments described herein, the second curable material is an acrylamide substituted by at least one hydrogen bon-forming chemical moiety.

According to some of any of the embodiments described herein, the acrylamide is substituted by a chemical moiety selected from hydroxyalkyl, alkoxyalkyl, aminoalkyl, alkylaminoalkyl, dialkylaminoalkyl, carboxyalkyl, hidrazinoalkyl, carbamoylalkyl, and an alkyl substituted by any other hydrogen bond-forming chemical moiety as described herein.

According to some of any of the embodiments described herein, a concentration of the second curable material ranges from 5% to 40% by weight of the total weight of the formulation.

According to some of any of the embodiments described herein, a concentration of the first curable material ranges from 5 to 40, or from 5 to 30, or from 5 to 25, or from 5 to 20, or from 10 to 20, or from 5 to 15, or from 10 to 15, weight percents of the total weight of the formulation.

According to some of any of the embodiments described herein, a concentration of the first curable material is lower than 30%, or lower than 25%, or lower than 20%, or lower than 15% by weight of the total weight of the formulation.

According to some of any of the embodiments described herein, a concentration of the second curable monomer ranges from 1 to 40, or from 1 to 30, or from 1 to 20, or from 5 to 20, or from 5 to 15, or from 5 to 10, weight percents of the total weight of the formulation.

According to some of any of the embodiments described herein, the water-miscible polymer comprises a polyol.

According to some of any of the embodiments described herein, the polyol is selected from the group consisting of Polyol 3165, polypropylene glycol, and polyglycerol.

According to some of any of the embodiments described herein, a concentration of the water-miscible polymer ranges from 30% to 80% by weight of the total weight of the formulation.

According to some of any of the embodiments described herein, the formulation further comprises an initiator, and optionally an additional agent, such as a surface active agent and/or an inhibitor and/or stabilizer.

According to some of any of the embodiments described herein, a cured support material formed upon exposing the formulation to a curing energy is dissolvable in an alkaline solution.

According to some of any of the embodiments described herein, a dissolution time of a cured support material when immersed in the alkaline solution is at least 2-folds, or at least 4-folds, shorter than a dissolution time of a cured support material made of a comparable support material formulation that is absent the second curable material as described herein in any of the respective embodiments.

According to some of any of the embodiments described herein, a dissolution time of a 16-grams cube made of the cured support material and immersed in 800 mL of the alkaline solution is less than 10 hours, or less than 5 hours, or less than 2 hours.

According to some of any of the embodiments described herein, the alkaline solution comprises an alkali metal hydroxide.

According to some of any of the embodiments described herein, the alkaline solution further comprises an alkali metal silicate.

According to some of any of the embodiments described herein, a 20 mm×20 mm×20 mm object made of (e.g., printed by inkjet printing, or prepared in a mold) the support material formulation and formed upon exposing the formulation to a curing energy is characterized by a mechanical strength of at least 100 N.

According to some of any of the embodiments described herein, a cured support material formed upon exposing the formulation to a curing energy is characterized by a mechanical strength that is lower than a mechanical strength of a cured support material made of a comparable support material formulation that is absent the second curable material and comprises substantially the same total concentration of curable materials as the formulation, by no more than 50% or by no more than 40%, or by no more than 30%.

According to an aspect of some embodiments of the present invention there is provided a method of fabricating a three-dimensional model object, the method comprising dispensing a building material so as to sequentially form a plurality of layers in a configured pattern corresponding to the shape of the object, wherein the building material comprises a modeling material formulation and a support material formulation, and wherein the support material formulation comprises the formulation as described herein in any of the respective embodiments.

According to some of any of the embodiments described herein, the method further comprises, subsequent to the dispensing, exposing the building material to curing energy, to thereby obtain a printed objected comprised of a cured modeling material and a cured support material.

According to some of any of the embodiments described herein, the method further comprises removing the cured support material, to thereby obtain the three-dimensional model object.

According to some of any of the embodiments described herein, the removing comprises contacting the cured support material with a cleaning solution, for example, an alkaline solution.

According to some of any of the embodiments described herein, the cleaning solution comprises an alkali metal hydroxide.

According to some of any of the embodiments described herein, the cleaning solution further comprises an alkali metal silicate.

According to an aspect of some embodiments of the present invention there is provided a three-dimensional object fabricated by the method as described herein.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

Figure 1:
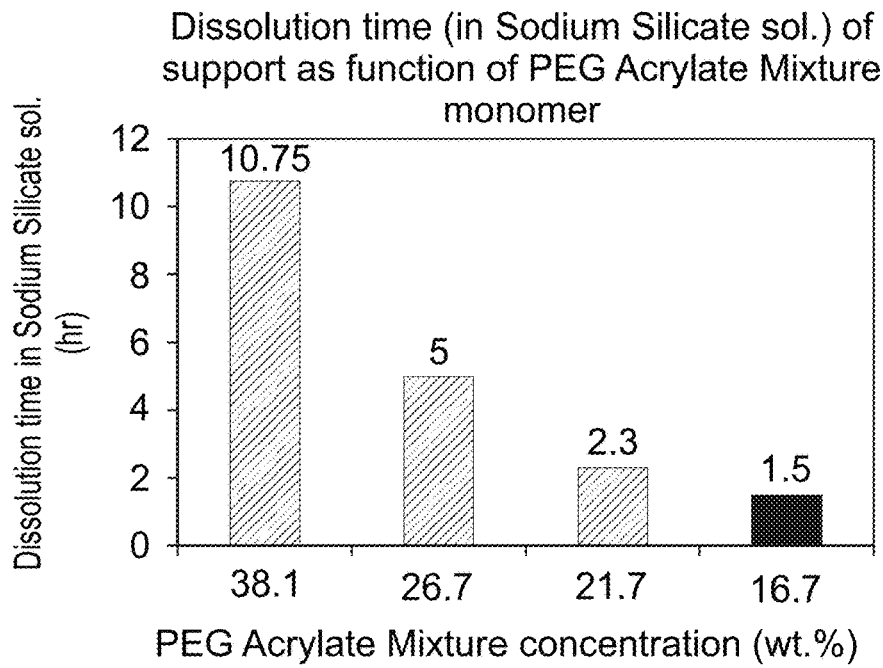
FIG. 1 is a bar graph presenting the dissolution time, in an exemplary alkaline solution as described herein, of a printed 16-grams cube formed of a support material formulation comprising an exemplary first curable material as described herein, as a function of the concentration of the first curable material (dashed bars) and of the same cube formed of a support material formulation in which 10% of an exemplary second curable material (HAA) were added to the first curable material (black bar)

The present invention, in some embodiments thereof, relates to additive manufacturing (AM), and more particularly, but not exclusively, to formulations useful for forming a support material in additive manufacturing such as three-dimensional inkjet printing, and to methods of additive manufacturing utilizing same.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

The present inventors have searched for a support material formulation suitable for use in additive manufacturing, as described herein, that can be removed from a printed object made upon dispensing the formulation, typically along with dispensing a modeling material formulation, in low dissolution times and high dissolution rates, without compromising the mechanical properties of the cured support material.

Support material formulations typically comprise a water-miscible non-curable polymer and a curable material. The curable material can comprise a mono-functional curable material, and/or a multi-functional curable material and/or a cross-linking agent.

Cured support materials that are characterized by a mechanical strength that is suitable for, for example, 3D inkjet printing, often comprise a curable material that upon curing, exhibits intermolecular interactions between the polymeric chains formed upon exposing the support material formulation to curing energy, that attribute to the mechanical strength.

Such intermolecular interactions include, for example, hydrogen bonds, electrostatic interactions, aromatic interactions, and chemical cross-linking.

For example, cured support materials that are characterized by a mechanical strength that is suitable for, for example, 3D inkjet printing, may exhibit at least some degree of cross-linking, that is, at least some of the polymeric chains formed upon exposing the support material formulation to curing energy, are chemically cross-linked therebetween.

Such a cross-linking can be obtained, for example, when the curable material comprises a multi-functional curable material and/or another cross-linking agent.

By "chemical cross-linking" or "chemically cross-linked" it is meant that the polymeric chains are linked to one another via covalent bonds, for example, two or more polymeric chains are each covalently bound to the cross-linking compound (e.g., to a polymer formed from multi-functional curable material).

The presence of chemically cross-linked polymeric chains in a cured support material is assumed to provide the cured support material with the desired mechanical strength, yet, it also adversely affects the dissolution of the cured support material in an aqueous solution.

Cured support materials that exhibit some degree of cross-linking, or otherwise exhibit high mechanical strength as a result of intermolecular interactions as described herein, are often not water-soluble, and require harsh conditions, for example, concentrated alkaline solutions, for effecting chemical dissolution thereof.

The present inventors have studied the effect of reducing a concentration of a multi-functional curable material on the dissolution rate and time of a cured support material, and have uncovered that while the dissolution rate indeed increases, the mechanical strength of the cured support material is adversely decreased.

While searching for a solution to this problem, the present inventors have uncovered that introducing to a support material formulation a curable material, which is capable of interfering with the intermolecular interactions described herein, while reducing the concentration of multi-functional curable material in the formulation, results in support material formulations that upon exposure to curing energy provide a cured support material that is characterized by the desired reduced dissolution time and increased dissolution rate, while maintaining a desirable mechanical strength.

The present inventors have designed and successfully prepared and practiced novel support material formulations, which can easily and efficiently be removed by dissolution in an alkaline solution, without compromising the mechanical strength of the cured support material formed upon exposing the formulation to a suitable curing energy, as described herein. The present inventors have shown that these novel formulations are usable for forming a soluble hardened support material in 3D inkjet printing methods, and exhibit improved performance compared to currently known and/or available formulations for forming soluble hardened support materials.

Herein throughout, the term "object" or "printed object" describes a product of the manufacturing process. This term refers to the product obtained by a method as described herein, before removal of the support material. A printed object is therefore made of hardened (e.g., cured) modeling material and hardened (e.g., cured) support material.

The term "printed object" as used herein throughout refers to a whole printed object or a part thereof.

The term "model", as used herein, describes a final product of the manufacturing process. This term refers to the product obtained by a method as described herein, after removal of the support material. The model therefore essentially consists of a cured modeling material, unless otherwise indicated. This term is also referred to herein as "model object", "final object" or simply as "object".

The terms "model", "model object", "final object" and "object", as used herein throughout, refer to a whole object or a part thereof.

Herein throughout, the phrase "uncured building material" collectively describes the materials that are dispensed during the fabrication process so as to sequentially form the layers, as described herein. This phrase encompasses uncured materials dispensed so as to form the printed object, namely, one or more uncured modeling material formulation(s), and uncured materials dispensed so as to form the support, namely uncured support material formulations.

Herein throughout, the phrases "cured modeling material" and "hardened modeling material", which are used interchangeably, describe the part of the building material that forms a model object, as defined herein, upon exposing the dispensed building material to curing, and following removal of the cured support material. The cured modeling material can be a single cured material or a mixture of two or more cured materials, depending on the modeling material formulations used in the method, as described herein.

Herein throughout, the phrase "modeling material formulation", which is also referred to herein interchangeably as "modeling formulation" or simply as "formulation", describes a part of the uncured building material which is dispensed so as to form the model object, as described herein. The modeling formulation is an uncured modeling formulation, which, upon exposure to curing energy, forms the final object or a part thereof.

An uncured building material can comprise one or more modeling formulations, and can be dispensed such that different parts of the model object are made upon curing different modeling formulations, and hence are made of different cured modeling materials or different mixtures of cured modeling materials.

Herein throughout, the phrase "hardened support material" is also referred to herein interchangeably as "cured support material" or simply as "support material" and describes the part of the building material that is intended to support the fabricated final object during the fabrication process, and which is removed once the process is completed and a hardened modeling material is obtained.

Herein throughout, the phrase "support material formulation", which is also referred to herein interchangeably as "support formulation" or simply as "formulation", describes a part of the uncured building material which is dispensed so as to form the support material, as described herein. The support material formulation is an uncured formulation, which, upon exposure to curing energy, forms the hardened support material.

Herein throughout, the term "water-miscible" describes a material which is at least partially dissolvable or dispersible in water, that is, at least 50% of the molecules move into the water upon mixture. This term encompasses the terms "water-soluble" and "water dispersible".

Herein throughout, the term "water-soluble" describes a material that when mixed with water in equal volumes or weights, a homogeneous solution is formed.

Herein throughout, the term "water-dispersible" describes a material that forms a homogeneous dispersion when mixed with water in equal volumes or weights.

Herein throughout, the phrase "dissolution rate" describes a rate at which a substance is dissolved in a liquid medium. Dissolution rate can be determined, in the context of the present embodiments, by the time needed to dissolve a certain amount of support material. The measured time is referred to herein as "dissolution time".

Herein throughout, whenever the phrase "weight percents" is indicated in the context of embodiments of a support material formulation, it is meant weight percents of the total weight of the uncured support material formulation as described herein.

The phrase "weight percents" is also referred to herein as "% by weight" or "% wt.".

Herein throughout, some embodiments of the present invention are described in the context of the additive manufacturing being a 3D inkjet printing. However, other additive manufacturing processes, such as, but not limited to, SLA and DLP, are contemplated.

The support material formulations:

The present inventors have designed and successfully prepared and practiced a support material formulation which provides a cured support material that is characterized, for example, as follows:

by a dissolution time of a 20×20×20 mm cube made of the cured support material and immersed in 800 mL of the alkaline solution which is less than 10 hours, or less than 5 hours, or less than 2 hours, wherein the alkaline solution comprises 2% wt. NaOH and 1% wt. sodium metasilicate; and by a mechanical strength of a 20 mm×20 mm×20 mm cube made of the support material formulation of at least 100 N, as determined by a compression test as described in the Examples section that follows.

According to an aspect of some embodiments of the present invention, there is provided a support material formulation which comprises:

a non-curable water-miscible polymer;

a first water-miscible, curable material; and at least one second water-miscible curable material.

Herein throughout, a "curable material" is a compound or a mixture of compounds (monomeric and/or oligomeric and/or polymeric compounds) which, when exposed to curing energy, as described herein, solidify or harden to form a cured support material as defined herein. Curable materials are typically polymerizable materials, which undergo polymerization and/or cross-linking when exposed to suitable energy source.

A "curable material" is also referred to herein and in the art as "reactive" material.

In some of any of the embodiments described herein, a curable material is a photopolymerizable material, which polymerizes or undergoes cross-linking upon exposure to radiation, as described herein, and in some embodiments the curable material is a UV-curable material, which polymerizes or undergoes cross-linking upon exposure to UV-vis radiation, as described herein.

In some embodiments, a curable material as described herein is a polymerizable material that polymerizes via photo-induced radical polymerization.

In some of any of the embodiments described herein, a curable material can comprise a monomer, and/or an oligomer and/or a short-chain polymer, each being polymerizable as described herein.

In some of any of the embodiments described herein, when a curable material is exposed to curing energy (e.g., radiation), it polymerizes by any one, or combination, of chain elongation and cross-linking.

In some of any of the embodiments described herein, a curable material is a monomer or a mixture of monomers which can form a polymeric support material upon a polymerization reaction, when exposed to curing energy at which the polymerization reaction occurs. Such curable materials are also referred to herein as "monomeric curable materials", or as "curable monomers".

In some of any of the embodiments described herein, a curable material is a polymer or an oligomer or a mixture of polymers and/or oligomers which can form a polymeric support material upon a polymerization reaction, when exposed to curing energy at which the polymerization reaction occurs.

A curable material can comprise a mono-functional curable material and/or a multi-functional curable material.

Herein, a mono-functional curable material comprises one functional group that can undergo polymerization when exposed to curing energy (e.g., radiation). A multi-functional curable material comprises two or more groups that can undergo polymerization when exposed to curing energy (e.g., radiation), and which in addition can participate in chemical cross-linking of polymeric chains formed upon exposure to curing energy.

In some of any of the embodiments described herein, the curable materials described herein are water-soluble or at least water-miscible, e.g., water-dispersible, as defined herein.

The second curable material:

According to some embodiments of the present invention, the second curable material is selected capable of interfering with intermolecular interactions, as described herein, between polymeric chains formed upon exposing the first water-miscible material to curing energy.

According to some embodiments of the present invention, the second curable material is selected capable of forming hydrogen bonds with the polymeric chains formed upon exposing the first water-soluble material to curing energy.

According to some embodiments of the present invention, the second curable material is selected capable of interfering with a chemical cross-linking, as defined herein, between the polymeric chains formed upon exposing the first water-soluble material to curing energy.

According to some embodiments of the present invention, the second curable material is selected capable of reducing a degree of a chemical cross-linking between the polymeric chains.

As discussed above, chemical cross-linking in a cured support material can be formed when a multi-functional curable material is present in the support material formulation.

In some embodiments, the second curable material is capable of interfering in, or reducing the degree of, chemical cross-linking that is imparted by a multi-functional curable material that is present in the support material formulation.

In some embodiments, the second curable material is capable of forming hydrogen bonds with the polymeric chains formed upon curing the first curable material, and thereby reduces the intermolecular interactions between these polymeric chains and/or reduces the degree of chemical cross-linking between the polymeric chains.

According to some of any of the embodiments described herein, the first curable material comprises a mixture of a mono-functional curable material, as described herein, and a multi-functional (e.g., di-functional) curable material, as described herein.

According to some of any of the embodiments described herein, the second curable material features at least two hydrogen bond-forming chemical moieties.

The phrase "hydrogen bond-forming chemical moiety" or "hydrogen bond-forming moiety", as used herein, describes a moiety, or group, or atom, that is capable of forming hydrogen bonds by being a hydrogen bond donor or a hydrogen bond acceptor. Certain chemical moieties or groups can include both a hydrogen bond donor and a hydrogen bond acceptor.

As used herein and known in the art, a "hydrogen bond" is a relatively weak bond that forms a type of dipole-dipole attraction which occurs when a hydrogen atom bonded to a strongly electronegative atom exists in the vicinity of another electronegative atom with a lone pair of electrons.

The hydrogen atom in a hydrogen bond is partly shared between two relatively electronegative atoms.

Hydrogen bonds typically have energies of 1-3 kcal mol$^{-1}$ (4-13 kJ mol$^{-1}$), and their bond distances (measured from the hydrogen atom) typically range from 1.5 to 2.6 Å.

A hydrogen-bond donor is the group that includes both the atom to which the hydrogen is more tightly linked and the hydrogen atom itself, whereas a hydrogen-bond acceptor is the atom less tightly linked to the hydrogen atom. The relatively electronegative atom to which the hydrogen atom is covalently bonded pulls electron density away from the hydrogen atom so that it develops a partial positive charge ($\delta^+$). Thus, it can interact with an atom having a partial negative charge ($\delta^-$) through an electrostatic interaction.

Atoms that typically participate in hydrogen bond interactions, both as donors and acceptors, include oxygen, nitrogen and fluorine. These atoms typically form a part of chemical group or moiety such as, for example, carbonyl, carboxylate, amide, hydroxyl, amine, imine, alkylfluoride, $F_2$, and more. However, other electronegative atoms and chemical groups or moieties containing same may participate in hydrogen bonding.

According to some of any of the embodiments described herein, each of the two or more hydrogen bond-forming chemical moieties in the second curable material independently comprises one or more oxygen atoms and/or nitrogen atoms, which participate in hydrogen bond formation, as described herein.

Exemplary hydrogen bond-forming chemical moieties include, but are not limited to, amide, carboxylate, hydroxy, alkoxy, aryloxy, ether, amine, carbamate, hydrazine, a nitrogen-containing heteralicyclic (e.g., piperidine, oxalidine), and an oxygen-containing heteralicyclic (e.g., tetrahydrofuran, morpholine), and any other chemical moiety that comprises one or more nitrogen and/or oxygen atoms.

The hydrogen bond-forming moieties in the second curable monomer can be separated from one another by, for example, 2-20, or 2-10, or 2-8, or 2-6 or 2-4 atoms, including any subranges and intermediate values therebetween, which can be regarded as a linking moiety linking between the hydrogen bind-forming moieties.

Thus, in some embodiments, the distance between at least two of the hydrogen bond-forming chemical moieties is of, for example, 2-10, or 2-8, or 2-6 or 2-4 atoms.

In some embodiments, the two or more hydrogen bond-forming chemical moieties are separated from one another by an alkylene chain, and hence the above-described atoms are carbon atoms.

According to some of any of the embodiments described herein, the second curable material is a UV-curable material, as described herein.

According to some of any of the embodiments described herein, the second curable material is an acrylate. The carboxylate in the acrylate is a hydrogen bond-forming moiety as described herein.

According to some of any of the embodiments described herein, the second curable material is an acrylamide. The amide in the acrylamide is a hydrogen bond-forming moiety as described herein.

According to some of any of the embodiments described herein, the second curable material is an acrylamide substituted by one or hydrogen bond-forming chemical moiety or moieties, as described herein. In some embodiments, a hydrogen bond-forming moiety and the amide (which is another hydrogen bond-forming moiety) are linked to one another, or separated, by an alkyl.

In some embodiments, the second curable material is an acrylamide substituted by a chemical moiety such as, but not limited to hydroxyalkyl, alkoxyalkyl, aminoalkyl, alkylaminoalkyl, dialkylaminoalkyl, carboxyalkyl, hidrazinoalkyl, carbamoylalkyl, and an alkyl substituted by any other hydrogen bond-forming chemical moiety as described herein.

In some embodiments, the alkyl is a C(1-10)alkyl, or a C(2-10)alkyl, or a C(2-8)alkyl, or a C(2-6)alkyl, or a C(2-4)alkyl, or is ethyl.

According to some of any of the embodiments described herein, the second curable material is represented by Formula I:

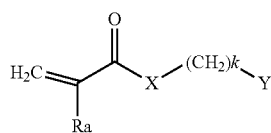

Formula I wherein:

Ra is selected from H, C(1-4)alkyl (e.g., methyl) or, optionally, can be a hydrophilic group, as described herein;

k is an integer ranging from 1 to 10, or from 2-10, or from 2 to 8, or from 2 to 6, or from 2 to 4, or is 2 or 3; and X and Y are each independently a hydrogen bond-forming moiety that comprises at least one nitrogen and/or oxygen atom, as described herein.

In some embodiments, Y can be hydroxyl, alkoxy, aryloxy, amine, alkylamine, dialkylamine, carboxylate, hydrazine, carbamate, hydrazine, a nitrogen-containing heteralicyclic, and an oxygen-containing heteralicyclic, as defined herein.

In some embodiments, X is —O—, and in some of these embodiments, Ra is H, such that the second curable material is an acrylate. When Ra is methyl, the second curable material is a methacrylate.

In some embodiments, X is -NRc-, wherein Rc can be, for example, hydrogen, alkyl, cycloalkyl or aryl, wherein the alkyl, cycloalkyl and aryl can be substituted or unsubstituted, as described herein. In these embodiments, when Ra is H, the second curable material is an acrylamide. When Ra is methyl, the second curable material is methacrylamide.

In some of any of the embodiments described herein, the second curable material is represented by Formula I, wherein:

X is NH; k is 2 or 3, and Y is hydroxyl.

In some of any of the embodiments described herein, the second curable material is represented by Formula I, wherein:

X is NH; k is 2 or 3, and Y is amine, alkylamine or dialkylamine, for example, dimethylamine.

In some of any of the embodiments described herein, the second curable material is represented by Formula I, wherein:

Ra is H; X is NH; k is 2 or 3, and Y is hydroxyl.

In some of any of the embodiments described herein, the second curable material is represented by Formula I, wherein:

Ra is methyl; X is NH; k is 2 or 3, and Y is hydroxyl.

In some of any of the embodiments described herein, the second curable material is represented by Formula I, wherein:

Ra is H, X is NH; k is 2 or 3, and Y is dimethylamine.

In some of any of the embodiments described herein, the second curable material is represented by Formula I, wherein:

Ra is methyl, X is NH; k is 2 or 3, and Y is dimethylamine.

In some of any of the embodiments described herein, the second curable material comprises one or more curable materials or one or more of any of the compounds described in any of the respective embodiments herein.

In some of any of the embodiments described herein, the second curable material comprises a mixture of two or more curable materials represented by Formula I herein, and is some embodiments it comprises two or more substituted acryl amides as described herein.

In some of any of the embodiments described herein, one or more of curable materials in the second curable material is characterized by a Tg of a polymer formed therefrom which is higher than 100° C., or higher than 110° C., or higher than 120° C., or higher than 130° C.

The first curable material:

In some of any of the embodiments described herein, the first curable material is a UV-curable material.

In some of any of the embodiments described herein, each of the first and second mono-functional materials is a UV-curable material.

In some of any of the embodiments described herein, each of the first and second mono-functional materials independently comprises an acrylate, a methacrylate, an acrylamide or a methacrylamide curable moiety (or moieties).

In some of any of the embodiments described herein, the first curable material comprises a mono-functional curable material.

In some of any of the embodiments described herein, the first curable material comprises a multi-functional, e.g., di-functional curable material.

In some of any of the embodiments described herein, the first curable material comprises a mixture of a multi-functional, e.g., di-functional curable material and a mono-functional curable material.

A curable mono-functional material forming the first curable material according to some embodiments of the present invention can comprise one or more of a vinyl-containing compound represented by Formula II:

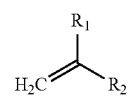

Formula II

The (=CH$_2$) group in Formula I represents a polymerizable group, and is typically a UV-curable group, such that the material is a UV-curable material.

In some embodiments, R$_1$ is a carboxylate, and the compound is a mono-functional acrylate. In some of these embodiments, R$_2$ is methyl, and the compound is mono-functional methacrylate. In other embodiments, R$_2$ is hydrogen, and the compound is a mono-functional acrylate. R$_2$ can be hydrogen, a C(1-4)alkyl, or can be a hydrophilic group.

In some of any of these embodiments, the carboxylate group is —C(=O)—OR', with R' being selected from, for example, alkyl, cycloalkyl, heteroalicyclic groups containing nitrogen and/or oxygen atoms such as morpholine, tetrahydrofuran, oxalidine, and the likes, C(1-4)alkyl optionally substituted or interrupted by one or more of e.g., hydroxy, —O—, amine or —NH—), hydroxy, thiol, an alkylene glycol, a poly(alkylene glycol) or an oligo(alkylene glycol).

An exemplary mono-functional curable material forming the first curable material is a poly(alkylene glycol) acrylate such as poly(ethylene glycol) acrylate. Other water soluble acrylate or methacrylate mono-functional monomers are contemplated.

An exemplary mono-functional curable material forming the first curable material is represented by Formula IV:

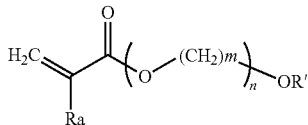

Formula IV wherein:

n is an integer ranging from 2 to 10, or from 2 to 8;

m is an integer ranging from 2 to 6, preferably from 2 to 4, or is 2 or 3;

R' can be hydrogen, alkyl, cycloalkyl, or aryl; and

Ra is H or C(1-4)alkyl.

In some of any of the embodiments of Formula IV, R' is hydrogen.

In some of any of the embodiments of Formula IV, m is 2, and Ra is H, such that the compound is a poly(ethylene glycol) acrylate.

In some of any of the embodiments of Formula IV, m is 2, and Ra is methyl, such that the compound is a poly(ethylene glycol) methacrylate. In some of any of the embodiments of Formula IV, R' is H, and is some of any of the embodiments of Formula IV, n is 4, 5, 6, 7 or 8, for example, 6.

In some embodiments, $R_1$ in Formula II is amide, and the compound is a mono-functional acrylamide. In some of these embodiments, $R_2$ is methyl, and the compound is mono-functional methacrylamide. In some of these embodiments, the amide is substituted. For example, the amide group is —C(═O)—NR'R" wherein R' and R" are as described herein. An exemplary such monomer includes acryloyl morpholine (ACMO). Other water soluble acrylamide or methacrylamide mono-functional monomers are contemplated.

In some embodiments, one or both of $R_1$ and $R_2$ is a group other than carboxylate or amide, for example, is a cyclic amide (lactam), a cyclic ester (lactone), a phosphate, phosphonate, sulfate, sulfonate, alkoxy, substituted alkoxy, or else. In such embodiments, the curable material is a substituted vinyl monomer. Exemplary such vinyl monomers are vinyl phosphonic acid and hydroxybutyl vinyl ether. Other water soluble mono-functional vinyl ethers or otherwise substituted vinyl monomers are contemplated.

In some of any of the embodiments described herein, the first curable material comprises one or more of the mono-functional curable monomers as described herein.

In some of any of the embodiments described herein, a di-functional curable monomer that may form a part of the first curable material, optionally and preferably in addition to the mono-functional curable material described in the connect of the first curable material, is represented by the Formula III:

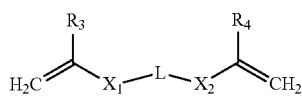

Formula III wherein:

each of $R_3$ and $R_4$ is independently hydrogen, C(1-4)alkyl, or a hydrophilic group;

L is a linking moiety; and each of $X_1$ and $X_2$ is independently a carboxylate, an amide, or any other group as defined herein for $R_1$ in Formula II.

Di-functional curable monomers of Formula III in which one or both of $X_1$ and $X_2$ is carboxylate, are di-functional acrylates. When one or more of $R_3$ and $R_4$ is methyl, the curable monomer is a di-functional methacrylate.

In some embodiments, L is a polymeric or oligomeric moiety. In some embodiments, L is or comprises an alkylene glycol moiety, or a poly(alkylene glycol) moiety. In some embodiments, L is an alkylene moiety, optionally interrupted by one or more heteroatoms such as O, S or by NR'.

Exemplary di-functional curable monomers include polyethylene glycol diacrylate, polyethylene glycol dimethacrylate, polyethylene glycol-polyethylene glycol urethane diacrylate, and a partially acrylated polyol oligomer.

In some embodiments of Formula III, $R_3$ and $R_4$ are each hydrogen, and $X_1$ and $X_2$ are each carboxylate, such that the di-functional curable material is a diacrylate.

In some of these embodiments, L is a poly(alkylene glycol).

In some of any of the embodiments described herein, a di-functional curable material forming a part of the first curable material is a poly(alkylene glycol) diacrylate represented by Formula V:

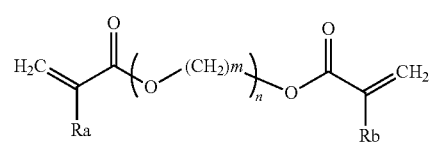

Formula V wherein:

n is an integer ranging from 2 to 40, or from 2 to 20, or from 2 to 10, or from 2 to 8;

m is an integer ranging from 2 to 6, preferably from 2 to 4, or is 2 or 3; and Ra and Rb are each independently H or C(1-4)alkyl.

In some of these embodiments, Ra and Rb are each H.

In some of these embodiments, m is 2.

In some of these embodiments, n is 4, 5, 6, 7 or 8, for example, 6.

In some embodiments of Formula III, one or both of $X_1$ and $X_2$ is —O—, such that at least one functional moiety in the di-functional curable material is vinyl ether.

Multi-functional curable materials contemplated in embodiments of the first curable material can be, for example, of Formula III, as described herein, wherein the L linking moiety is substituted by one or moieties that independently comprise a —$X_3$—C(═O)—$CR_5$—$CH_2$, wherein $X_3$ is as described herein for $X_1$ and $X_2$, and $R_5$ is as described herein for $R_3$ and $R_4$.

Other multi-functional curable materials and mono-functional curable materials known in the art as usable in support material formulations are also contemplated.

In some of any of the embodiments described herein, the support material formulation comprises a mixture of a mono-functional curable material and a multi-functional curable material, and in some of these embodiments the multi-functional curable material is a di-functional curable material as described herein in any of the respective embodiments and any combination thereof.

Any other curable monomer that is usable for forming cured support materials in AM processes is contemplated herein as included in a support material formulation, in addition to, or instead of, the curable materials described herein.

Exemplary other curable monomers include, without limitation, diacrylates such as polyurethane diacrylate oligomer and/or monomeric diacrylates, preferably short chain diacrylates such as, but not limited to, isobornyl diacrylate.

In some of any of the embodiments described herein, the first curable material comprises a poly(alkylene glycol) acrylate, as described herein.

In some of any of the embodiments described herein, the first curable material comprises a mono-functional poly (alkylene glycol) acrylate (e.g., Formula IV).

In some of any of the embodiments described herein, the first curable material comprises a mixture of a mono-functional poly(alkylene glycol) acrylate and a multi-functional, e.g., di-functional, poly(alkylene glycol) acrylate.

In some of any of the embodiments described herein, the first curable material comprises a mixture of a poly(alkylene glycol) acrylate (e.g., of Formula IV) and a poly(alkylene glycol) diacrylate (e.g., of Formula V).

In some of any of these embodiments the poly(alkylene glycol) is poly(ethylene glycol).

In some of these embodiments, a weight ratio between the mono-functional poly(alkylene glycol) acrylate and the di-functional poly(alkylene glycol) acrylate (e.g., poly(alkylene glycol) diacrylate) in the first curable material ranges from 70:30 to 95:5, and can be, for example, 70:30, 75:25, 80:20, 85:15, 90:10 or 95:5.

In some of any of the embodiments described herein, the first curable material comprises a mixture of a mono-functional curable material and a multi-functional curable material, and a weight ratio between these materials ranges from 50:50 to 95:5, and can be, for example, 50:50, 60:40, 70:30, 75:25, 80:20, 85:15, 90: 10 or 95:5.

The water miscible non-curable polymer:

In some of any of the embodiments described herein, a support material formulation comprises, in addition to the curable monomers, a water-miscible polymeric material, which can be any of the water-miscible polymeric materials commonly used in support material formulations.

In some of any of the embodiments described herein, the water-miscible polymeric material is non-curable (also referred to herein as "non-reactive"). The term "non-curable" encompasses polymeric materials that are non-polymerizable under any conditions or polymeric materials that are non-curable under conditions at which the mono-functional monomer as described herein is curable, or under any condition used in a fabrication of an object. Such polymeric materials are typically devoid of a polymerizable group or of a UV-photopolymerizable group. In some embodiments, the polymeric material is non-reactive towards the curable monomer as described herein, that is, it does not react with the monomer and is incapable of interfering with the curing of the monomer, under the fabrication conditions, including the curing conditions.

In some of any of the embodiments described herein the polymeric material is water soluble or water dispersible or water miscible polymeric material, as defined herein.

In some embodiments, the polymeric material comprises a plurality of hydrophilic groups as defined herein, either within the backbone chain of the polymer or as pendant groups. Exemplary such polymeric materials are polyols. Some representative examples include, but are not limited to, Polyol 3165, polypropylene glycol, polyethylene glycol, poly glycerol, ethoxylated forms of these polymers, paraffin oil and the like, and any combination thereof.

In some of any of the embodiments described herein, the support material formulation further comprises a water-miscible, non-curable, non-polymeric material, such as, for example, propane diol (e.g., 1,2-propandoil).

In some of any of the embodiments described herein, the support material formulation comprises a water-miscible, non-curable material which comprises a mixture of two or more or more of the polymeric and non-polymeric water-miscible, non-curable materials described herein. An exemplary such a mixture may comprise two or more of a polyethylene glycol, a propane diol and a polyol such as Polyol 3165.

Additional agents:

A support material formulation as described herein in any of the respective embodiments can further comprise additional agents, for example, initiators, inhibitors, stabilizers and the like.

In some of any of the embodiments described herein, and any combination thereof, the support material formulation further comprises an initiator, for inducing a polymerization of the curable materials upon exposure to curing energy or curing conditions.

In some of these embodiments, one or more or all of the curable materials is a UV-curable material and the initiator is a photoinitiator.

The photoinitiator can be a free radical photo-initiator, a cationic photo-initiator, or any combination thereof.

A free radical photoinitiator may be any compound that produces a free radical upon exposure to radiation such as ultraviolet or visible radiation and thereby initiates a polymerization reaction. Non-limiting examples of suitable photoinitiators include phenyl ketones, such as alkyl/cycloalkyl phenyl ketones, benzophenones (aromatic ketones) such as benzophenone, methyl benzophenone, Michler's ketone and xanthones; acylphosphine oxide type photo-initiators such as 2,4,6-trimethylbenzolydiphenyl phosphine oxide (TMPO), 2,4,6-trimethylbenzoylethoxyphenyl phosphine oxide (TEPO), and bisacylphosphine oxides (BAPO's); benzoins and benzoin alkyl ethers such as benzoin, benzoin methyl ether and benzoin isopropyl ether and the like. Examples of photoinitiators are alpha-amino ketone, and 1-hydroxycyclohexyl phenyl ketone (e.g., marketed as Igracure® 184).

A free-radical photo-initiator may be used alone or in combination with a co-initiator. Co-initiators are used with initiators that need a second molecule to produce a radical that is active in the UV-systems. Benzophenone is an example of a photoinitiator that requires a second molecule, such as an amine, to produce a curable radical. After absorbing radiation, benzophenone reacts with a ternary amine by hydrogen abstraction, to generate an alpha-amino radical which initiates polymerization of acrylates. Non-limiting example of a class of co-initiators are alkanolamines such as triethylamine, methyldiethanolamine and triethanolamine.

Suitable cationic photoinitiators include, for example, compounds which form aprotic acids or Bronstead acids upon exposure to ultraviolet and/or visible light sufficient to initiate polymerization. The photoinitiator used may be a single compound, a mixture of two or more active compounds, or a combination of two or more different compounds, i.e. co-initiators. Non-limiting examples of suitable cationic photoinitiators include aryldiazonium salts, diaryliodonium salts, triarylsulphonium salts, triarylselenonium salts and the like. An exemplary cationic photoinitiator is a mixture of triarylsolfonium hexafluoroantimonate salts.

In some of any of the embodiments described herein, the uncured support material formulation may further comprise one or more additional agents that are beneficially used in the fabrication process. Such agents include, for example, surface active agents, inhibitors and stabilizers.

In some embodiments, a support material formulation as described herein comprises a surface active agent. A surface-active agent may be used to reduce the surface tension of the formulation to the value required for jetting or for other printing process, which is typically around 30 dyne/cm. An exemplary such agent is a silicone surface additive such as, but not limited to, a surface agent marketed as BYK-345.

In some embodiments, a support material formulation as described herein further comprises an inhibitor, which inhibits pre-polymerization of the curable material during the fabrication process and before it is subjected to curing conditions. An exemplary stabilizer (inhibitor) is Tris(N-nitroso-N-phenylhydroxylamine) Aluminum Salt (NPAL) (e.g., as marketed under FirstCure®NPAL).

Suitable stabilizers include, for example, thermal stabilizers, which stabilize the formulation at high temperatures.

In some of any of the embodiments described herein, the support material formulation is devoid of a silicon polyether.

Exemplary support material formulations:

According to some of any of the embodiments described herein, the support material formulation is such that a concentration of the non-curable water-miscible polymer ranges from 30% to 80% by weight of the total weight of the formulation.

According to some of any of the embodiments described herein, the support material formulation is such that a concentration of the second curable material ranges from 5% to 40% by weight of the total weight of the formulation. In some embodiments, a concentration of the second curable material ranges from 5% to 30%, or from 5% to 20%, or from 5% to 10%, of the total weight of the formulation.

According to some of any of the embodiments described herein, the support material formulation is such that a concentration of the second curable monomer ranges from 1 to 40, or from 1 to 30, or from 1 to 20, or from 5 to 20, or from 5 to 15, or from 5 to 10, weight percents of the total weight of the formulation.

The second curable material according to these embodiments can be a mixture of two or more curable materials and the above concentrations apply to a total concentration of these materials.

When a mixture of two curable materials forms the second curable material, the weight ratio of these materials can be from 50:50 to 95:5, and can be, for example, 50:50, or 60:40, or 70:30, or 80:20, or 90:10, or 10:90, or 80:20, or 70:30, or 40:60.

According to some of any of the embodiments described herein, the support material formulation is such that a concentration of the first curable material ranges from 5 to 40, or from 5 to 30, or from 5 to 25, or from 5 to 20, or from 10 to 20, or from 5 to 15, or from 10 to 15, weight percents of the total weight of the formulation.

According to some of any of the embodiments described herein, the support material formulation is such that a concentration of the first curable material is lower than 30%, or lower than 20%, or lower than 15% by weight of the total weight of the formulation.

According to some of any of the embodiments described herein, the support material formulation is such that a total concentration of the first and second curable materials ranges from 10 to 45 weight percents, or from 10 to 40 weight percents, or from 10 to 30 weight percents, or from 15 to 45 weight percents, or from 10 to 20 weight percents, of the total weight of the formulation. Any combination of concentrations of the first and second curable materials is contemplated.

According to some of any of the embodiments described herein, the support material formulation is such that the first curable material comprises a mixture of a mono-functional curable material and a multi-functional (e.g., di-functional) curable material, at a weight ratio as described herein, and a concentration of the mono-functional curable material ranges from 5 to 35 or from 5 to 30 weight percents of the total weight of the formulation, and the concentration of the multi-functional (e.g., di-functional) curable material ranges from 0.5 to 10, or from 0.5 to 8, or from 0.5 to 5, weight percents, of the total weight of the formulation.

According to some of any of the embodiments described herein, the support material formulation is such that:

a concentration of the water-miscible non-curable polymer ranges from 30% to 80% by weight of the total weight of the formulation;

the first curable material comprises a mixture of a mono-functional curable material and a multi-functional (e.g., di-functional) curable material, at a weight ratio of, for example, 90:10;

a concentration of the mono-functional curable material ranges from 5 to 35 or from 5 to 30 weight percents of the total weight of the formulation;

the concentration of the multi-functional (e.g., di-functional) curable material ranges from 0.5 to 10, or from 0.5 to 8, or from 0.5 to 5, weight percents, of the total weight of the formulation; and the second curable material comprises one or two curable materials at a total concentration of from 5 to 40, or from 5 to 15 weight percents of the total weight of the composition.

According to some of any of the embodiments described herein, the support material formulation is such that:

a concentration of the water-miscible non-curable polymer ranges from 30% to 80% or from 40 to 80%, by weight of the total weight of the formulation;

the first curable material comprises a mono-functional curable material at a concentration that ranges from 5 to 35 or from 10 to 30 weight percents of the total weight of the formulation; and the second curable material comprises a curable material at a concentration of from 5 to 40, or from 5 to 15 weight percents of the total weight of the composition.

According to some of any of these embodiments, the first curable material comprises a poly(alkylene glycol) acrylate (e.g., of Formula IV), optionally in combination with a poly(alkylene glycol) diacrylate (e.g., of Formula V). In some of any of these embodiments the poly(alkylene glycol) is poly(ethylene glycol).

According to some of any of the embodiments described herein, the formulation is devoid of a multi-functional curable material, and is some embodiments, it is devoid of a poly(alkylene glycol) diacrylate (e.g., of Formula V).

According to some of any of the above embodiments, the second curable monomer comprises a compound represented by Formula I, wherein:

Ra is H; X is NH; k is 2 or 3, and Y is hydroxyl.

In some of any of the above embodiments, the second curable material comprises a represented by Formula I, wherein:

Ra is methyl; X is NH; k is 2 or 3, and Y is hydroxyl.

In some of any of the above embodiments, the second curable material comprises a represented by Formula I, wherein:

Ra is H, X is NH; k is 2 or 3, and Y is dimethylamine.

In some of any of the above embodiments, the second curable material comprises a represented by Formula I, wherein:

Ra is methyl, X is NH; k is 2 or 3, and Y is dimethylamine.

According to some of these embodiments, the support material formulation further comprises an initiator (e.g., a photoinitiator) at a concentration of from 0.1-2 weight percents of the total weight of the composition; and a surfactant, at a concentration of 0 to 2 weight percents of the total weight of the composition.

In some of any of the embodiments described herein, each of the curable materials included in the support material formulation is a UV-curable material, as defined herein, for example, an acrylate or a methacrylate or an acrylamide or a methacrylamide (mono-functional or multi-functional, monomeric or oligomeric).

Properties:

According to some of any of the embodiments described herein, the support material formulation exhibits a viscosity that is suitable for 3D inkjet printing.

In exemplary embodiments, the viscosity of the modeling formulation is lower than 30 cps, or lower than 25 cps, or lower than 20 cps, at the working temperature. In some embodiments, the viscosity of the formulation is higher at room temperature and can be, for example, above 50 cps, or above 80 cps, at room temperature.

In some of any of the embodiments described herein, the support material formulation is such that exhibit a viscosity of from 10 to 20 cps at room temperature. In some embodiments, the first and second curable materials, and the polymeric material, and the concentration of each, are selected or manipulated such that the formulation exhibits a desired viscosity as described herein (before curing).

According to some of any of the embodiments described herein, a cured support material formed upon exposing the formulation to a curing energy is dissolvable in an alkaline solution.

According to some of any of the embodiments described herein, a dissolution time of the cured support material when immersed in the alkaline solution is at least 2-folds, or at least 4-folds, shorter than a dissolution time of a cured support material made of a comparable support material formulation that is absent the second curable material.

By "comparable support material formulation" it is meant a support material formulation that comprises a water-miscible non-curable polymeric material as described herein and identical to a water-miscible polymeric material of the support formulation, and a first curable material as described herein, wherein a concentration of the first curable material in the comparable formulation is substantially the same as a total concentration of the first and second curable materials in the support material formulation.

According to some of any of the embodiments described herein, a dissolution time of a 16-grams cube (e.g., a 20 mm×20 mm×20 mm cube) made of the cured support material and immersed in 800 mL of the alkaline solution is less than 10 hours, or less than 5 hours, or less than 2 hours, preferably less than 2 hours According to some embodiments, the alkaline solution comprises an alkali metal hydroxide.

According to some embodiments, the alkaline solution further comprises an alkali metal silicate.

According to some embodiments, the support material formulation is such that a cured support material made therefrom is dissolvable in an alkaline solution that comprises a mixture of an alkali metal hydroxide and an alkali metal silicate, and the above dissolution times are with respect to such an alkaline solution.

In some embodiments, the alkaline solution comprises an alkali metal silicate at a concentration that ranges from 1 to 3 weight percent of the total weight of the solution, and an alkali metal hydroxide at a concentration that ranges from 1 to 3 weight percents of the total weight of the solution.

In some embodiments of the alkaline solution, a concentration of the alkali metal hydroxide is 2 weight percents of the total weight of the solution.

In some embodiments of the alkaline solution, a concentration of the alkali metal silicate is 1 weight percent of the total weight of the solution.

In some embodiments of the alkaline solution, the alkaline solution comprises sodium hydroxide at a concentration that ranges from 1-3 weight percents, or at a concentration of 2 weight percents; and sodium metasilicate at a concentration of 1-3 weight percents, or at a concentration of 1 weight percent.

According to some of any of the embodiments described herein, a 20 mm×20 mm×20 mm object made of the support material formulation and formed upon exposing the formulation to a curing energy is characterized by a mechanical strength of at least 100 N.

In some embodiments of the alkaline solution, a cured support material formed upon exposing the formulation to a curing energy is characterized by a mechanical strength that is lower from a mechanical strength of a cured support material made of a comparable support material formulation that is absent the second curable material, as defined herein, which comprises substantially the same total concentration of curable materials as the formulation, by no more than 50% or by no more than 40%, or by no more than 30%.

Model Fabrication:

According to an aspect of some embodiments of the present invention there is provided a method of fabricating a three-dimensional model object, which utilizes a support material formulation as described herein. The method is also referred to herein as a fabrication process or as a model fabrication process. In some embodiments, the method comprises dispensing an uncured building material so as to sequentially form a plurality of layers in a configured pattern corresponding to the shape of the object. In some embodiments, the (uncured) building material comprises a modeling material formulation and a support material formulation as described herein in any of the respective embodiments.

The modeling material formulation can be any modeling material formulation used in additive manufacturing such as 3D inkjet printing, and is preferably curable under the same conditions at which the support material formulation is curable. The support material formulation is as described herein in any of the respective embodiments and any combination thereof.

According to some embodiments of the present invention, the fabrication method is additive manufacturing of a three-dimensional model object.

According to some embodiments of this aspect, formation of each layer is effected by dispensing at least one uncured building material, and exposing the dispensed building material to curing energy or curing conditions, to thereby form a cured building material, which is comprised of a cured modeling material and a cured support material.

According to some of any of the embodiments described herein, the additive manufacturing is preferably by three-dimensional inkjet printing.

The method of the present embodiments manufactures three-dimensional objects in a layerwise manner by forming a plurality of layers in a configured pattern corresponding to the shape of the objects.

Each layer is formed by an additive manufacturing apparatus which scans a two-dimensional surface and patterns it. While scanning, the apparatus visits a plurality of target locations on the two-dimensional layer or surface, and decides, for each target location or a group of target locations, whether or not the target location or group of target locations is to be occupied by building material, and which type of building material (e.g., a modeling material formulation or a support material formulation) is to be delivered thereto. The decision is made according to a computer image of the surface.

When the AM is by three-dimensional printing, an uncured building material, as defined herein, is dispensed from a dispensing head having a set of nozzles to deposit building material in layers on a supporting structure. The AM apparatus thus dispenses building material in target locations which are to be occupied and leaves other target locations void. The apparatus typically includes a plurality of dispensing heads, each of which can be configured to dispense a different building material. Thus, different target locations can be occupied by different building materials (e.g., a modeling formulation and/or a support formulation, as defined herein).

In some of any of the embodiments of this aspect of the present invention, the method begins by receiving 3D printing data corresponding to the shape of the object. The data can be received, for example, from a host computer which transmits digital data pertaining to fabrication instructions based on computer object data, e.g., in a form of a Standard Tessellation Language (STL) or a StereoLithography Contour (SLC) format, Virtual Reality Modeling Language (VRML), Additive Manufacturing File (AMF) format, Drawing Exchange Format (DXF), Polygon File Format (PLY) or any other format suitable for Computer-Aided Design (CAD).

Next, droplets of the uncured building material as described herein are dispensed in layers, on a receiving medium, using at least two different multi-nozzle inkjet printing heads, according to the printing data. The receiving medium can be a tray of a three-dimensional inkjet system or a previously deposited layer. The uncured building material comprises a support material formulation as described herein for any of the respective embodiments and any combination thereof.

In some embodiments of the present invention, the dispensing is effected under ambient environment.

Optionally, before being dispensed, the uncured building material, or a part thereof (e.g., one or more formulations of the building material), is heated, prior to being dispensed. These embodiments are particularly useful for uncured building material formulations having relatively high viscosity at the operation temperature of the working chamber of a 3D inkjet printing system. The heating of the formulation(s) is preferably to a temperature that allows jetting the respective formulation through a nozzle of a printing head of a 3D inkjet printing system. In some embodiments of the present invention, the heating is to a temperature at which the respective formulation exhibits a viscosity of no more than X centipoises, where X is about 30 centipoises, preferably about 25 centipoises and more preferably about 20 centipoises, or 18 centipoises, or 16 centipoises, or 14 centipoises, or 12 centipoises, or 10 centipoises.

The heating can be executed before loading the respective formulation into the printing head of the 3D printing system, or while the formulation is in the printing head or while the composition passes through the nozzle of the printing head.

In some embodiments, the heating is executed before loading of the respective composition into the printing head, so as to avoid clogging of the printing head by the composition in case its viscosity is too high.

In some embodiments, the heating is executed by heating the printing heads, at least while passing the first and/or second composition through the nozzle of the printing head.

Once the uncured building material is dispensed on the receiving medium according to the 3D printing data, the method optionally and preferably continues by exposing the dispensed building material to conditions the effect curing. In some embodiments, the dispensed building material is exposed to curing energy by applying curing energy to the deposited layers. Preferably, the curing is applied to each individual layer following the deposition of the layer and prior to the deposition of the previous layer.

The curing energy or condition can be, for example, a radiation, such as an ultraviolet or visible irradiation, or other electromagnetic radiation, or electron beam radiation, depending on the building material used. The curing energy or condition applied to the dispensed layers serves for curing or solidifying or hardening the modeling material formulation and the support material formulation. Preferably, the same curing energy or condition is applied to effect curing of both the modeling materials and the support material. Alternatively, different curing energies or conditions are applied to the dispensed building material, simultaneously or sequentially, to effect curing of the modeling material formulation and the support material formulation.

According to some of any of the embodiments of this aspect of the present invention, once the building material is dispensed to form an object and curing energy or condition is applied, the cured support material is removed, to thereby obtain the final three-dimensional object.

According to some of any of the embodiments described herein, the support material is removed by contacting the cured support material with a cleaning composition for example, an alkaline solution as described in any of the respective embodiments described herein, and any combination thereof.

Contacting may be effected by means known in the art, for example, by immersing the printed object is an aqueous solution, e.g., an alkaline solution, and/or by jetting the alkaline solution onto the object. The contacting can be effected manually or in an automated manner. Any system or apparatus usable for removing a cured support material is contemplated.

In some of any of the embodiments described herein, the contacting is effected for a time period that is in correlation with the amount of the cured support material in the printed object, and the geometry thereof. For example, for a 16-grams, 20×20×20 mm cube made solely of an exemplary support material formulation as described herein the contacting is effected for a time period of no more than 120 minutes.

In some embodiments, the contacting is effected during a time period that is shorter by at least 20%, at least 30%, at least 40%, at least 50%, and even by 60%, 100%, 200%, 300%, 400 $ or shorter, compared to a time period required to remove a cured support material made of a comparable support material formulation as defined herein.

In some embodiments, the contacting is effected without replacing the cleaning composition (e.g., without introducing a fresh batch of a cleaning composition to the apparatus or system where removal of the cured support material is performed).

In some of any of the embodiments described herein, removal of the support material is effected by mechanical removal of the cured support material, either alone or in combination with dissolution in an alkaline solution as described herein. Any means known in the art for mechanically removing a support material are contemplated.

Any system suitable for AM of an object (e.g., a model object) is usable for executing the method as described herein.

A representative and non-limiting example of a system suitable for AM of an object according to some embodiments of the present invention comprises an additive manufacturing apparatus having a dispensing unit which comprises a plurality of dispensing heads. Each head preferably comprises an array of one or more nozzles, through which a liquid (uncured) building material is dispensed.

Preferably, but not obligatorily, the AM apparatus is a three-dimensional inkjet printing apparatus, in which case the dispensing heads are inkjet printing heads, and the building material is dispensed via inkjet technology. This need not necessarily be the case, since, for some applications, it may not be necessary for the additive manufacturing apparatus to employ three-dimensional printing techniques. Representative examples of additive manufacturing apparatus contemplated according to various exemplary embodiments of the present invention include, without limitation, binder jet powder based apparatus, fused deposition modeling apparatus and fused material deposition apparatus.

Each dispensing head is optionally and preferably fed via one or more building material reservoir(s) which may optionally include a temperature control unit (e.g., a temperature sensor and/or a heating device), and a material level sensor. To dispense the building material, a voltage signal is applied to the dispensing heads to selectively deposit droplets of material via the dispensing head nozzles, for example, as in piezoelectric inkjet printing technology. The dispensing rate of each head depends on the number of nozzles, the type of nozzles and the applied voltage signal rate (frequency). Such dispensing heads are known to those skilled in the art of solid freeform fabrication.

Optionally, but not obligatorily, the overall number of dispensing nozzles or nozzle arrays is selected such that half of the dispensing nozzles are designated to dispense support material formulations and half of the dispensing nozzles are designated to dispense modeling material formulations, i.e. the number of nozzles jetting modeling materials is the same as the number of nozzles jetting support material. Yet it is to be understood that it is not intended to limit the scope of the present invention and that the number of modeling material depositing heads (modeling heads) and the number of support material depositing heads (support heads) may differ. Generally, the number of modeling heads, the number of support heads and the number of nozzles in each respective head or head array are selected such as to provide a predetermined ratio, a, between the maximal dispensing rate of the support material and the maximal dispensing rate of modeling material. The value of the predetermined ratio, a, is preferably selected to ensure that in each formed layer, the height of modeling material equals the height of support material. Typical values for a are from about 0.6 to about 1.5.

For example, for a=1, the overall dispensing rate of support material formulation is generally the same as the overall dispensing rate of the modeling material formulation(s) when all modeling heads and support heads operate.

In a preferred embodiment, there are M modeling heads each having m arrays of p nozzles, and S support heads each having s arrays of q nozzles such that M×m×p=S×s×q. Each of the M×m modeling arrays and S×s support arrays can be manufactured as a separate physical unit, which can be assembled and disassembled from the group of arrays. In this embodiment, each such array optionally and preferably comprises a temperature control unit and a material level sensor of its own, and receives an individually controlled voltage for its operation.

The AM apparatus can further comprise a curing unit which can comprise one or more sources of a curing energy or a curing condition. The curing source can be, for example, a radiation source, such as an ultraviolet or visible or infrared lamp, or other sources of electromagnetic radiation, or electron beam source, depending on the modeling material formulation(s) being used. The curing energy source serves for curing or solidifying the building material formulation(s).

The dispensing head and curing energy source (e.g., radiation source) source are preferably mounted in a frame or block which is preferably operative to reciprocally move over a tray, which serves as the working surface (a receiving medium). In some embodiments of the present invention, the curing energy (e.g., radiation) sources are mounted in the block such that they follow in the wake of the dispensing heads to at least partially cure or solidify the materials just dispensed by the dispensing heads.

According to the common conventions, the tray is positioned in the X-Y plane, and is preferably configured to move vertically (along the Z direction), typically downward. In various exemplary embodiments of the invention, the AM apparatus further comprises one or more leveling devices, e.g. a roller, which serve to straighten, level and/or establish a thickness of the newly formed layer prior to the formation of the successive layer thereon. The leveling device preferably comprises a waste collection device for collecting the excess material generated during leveling. The waste collection device may comprise any mechanism that delivers the material to a waste tank or waste cartridge.

In use, the dispensing heads as described herein move in a scanning direction, which is referred to herein as the X direction, and selectively dispense building material in a predetermined configuration in the course of their passage over the tray. The building material typically comprises one or more types of support material formulations and one or more types of modeling material formulations. The passage of the dispensing heads is followed by the curing of the modeling and support material formulation(s) by the source of curing energy or condition (e.g., radiation). In the reverse passage of the heads, back to their starting point for the layer just deposited, an additional dispensing of building material may be carried out, according to predetermined configuration. In the forward and/or reverse passages of the dispensing heads, the layer thus formed may be straightened by the leveling device, which preferably follows the path of the dispensing heads in their forward and/or reverse movement. Once the dispensing heads return to their starting point along the X direction, they may move to another position along an indexing direction, referred to herein as the Y direction, and continue to build the same layer by reciprocal movement along the X direction. Alternatively, the dispensing heads may move in the Y direction between forward and reverse movements or after more than one forward-reverse movement. The series of scans performed by the dispensing heads to complete a single layer is referred to herein as a single scan cycle.

Once the layer is completed, the tray is lowered in the Z direction to a predetermined Z level, according to the desired thickness of the layer subsequently to be printed. The procedure is repeated to form a three-dimensional object which comprises a modeling material and a support material in a layerwise manner.

In some embodiments, the tray may be displaced in the Z direction between forward and reverse passages of the dispensing head, within the layer. Such Z displacement is carried out in order to cause contact of the leveling device with the surface in one direction and prevent contact in the other direction.

The system for performing the method as described herein optionally and preferably comprises a building material supply apparatus which comprises the building material containers or cartridges and supplies a plurality of building material formulations (modeling material formulation(s) and a support material formulation as described herein to the fabrication apparatus.

The system may further comprise a control unit which controls the fabrication apparatus and optionally and preferably also the supply apparatus as described herein. The control unit preferably communicates with a data processor which transmits digital data pertaining to fabrication instructions based on computer object data, stored on a computer readable medium, preferably a non-transitory medium, in a form of a Standard Tessellation Language (STL) format or any other format such as, but not limited to, the aforementioned formats. Typically, the control unit controls the voltage applied to each dispensing head or nozzle array and the temperature of the building material in the respective printing head.

Once the manufacturing data is loaded to the control unit, it can operate without user intervention. In some embodiments, the control unit receives additional input from the operator, e.g., using a data processor or using a user interface communicating with the control unit. The user interface can be of any type known in the art, such as, but not limited to, a keyboard, a touch screen and the like. For example, the control unit can receive, as additional input, one or more building material types and/or attributes, such as, but not limited to, color, characteristic distortion and/or transition temperature, viscosity, electrical property, magnetic property. Other attributes and groups of attributes are also contemplated.

Some embodiments contemplate the fabrication of an object by dispensing different materials from different dispensing heads. These embodiments provide, inter alia, the ability to select materials from a given number of materials and define desired combinations of the selected materials and their properties. According to the present embodiments, the spatial locations of the deposition of each material with the layer is defined, either to effect occupation of different three-dimensional spatial locations by different materials, or to effect occupation of substantially the same three-dimensional location or adjacent three-dimensional locations by two or more different materials so as to allow post deposition spatial combination of the materials within the layer, thereby to form a composite material at the respective location or locations.

Any post deposition combination or mix of modeling materials is contemplated. For example, once a certain material is dispensed it may preserve its original properties. However, when it is dispensed simultaneously with another modeling material or other dispensed materials which are dispensed at the same or nearby locations, a composite material having a different property or properties to the dispensed materials is formed.

The present embodiments thus enable the deposition of a broad range of material combinations, and the fabrication of an object which may consist of multiple different combinations of materials, in different parts of the object, according to the properties desired to characterize each part of the object.

Further details on the principles and operations of an AM system such as described herein is found in U.S. Patent Application having Publication No. 2013/0073068, the contents of which are hereby incorporated by reference.

According to some embodiments of each of the methods and systems described herein, the uncured building material comprises at least one support material formulation as described herein.

The Model object:

According to an aspect of some embodiments of the present invention, there is provided a three-dimension model object prepared by the method as described herein, in any of the embodiments thereof and any combination thereof.

According to an aspect of some embodiments of the present invention there is provided a 3D model object, fabricated by an AM method as described herein.

As used herein the term "about" refers to ±10%.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof. Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

As used herein the term "method" refers to manners, means, techniques and procedures for accomplishing a given task including, but not limited to, those manners, means, techniques and procedures either known to, or readily developed from known manners, means, techniques and procedures by practitioners of the chemical, pharmacological, biological, biochemical and medical arts.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Herein throughout, the phrase "linking moiety" or "linking group" describes a group that connects two or more moieties or groups in a compound. A linking moiety is typically derived from a bi- or tri-functional compound, and can be regarded as a bi- or tri-radical moiety, which is connected to two or three other moieties, via two or three atoms thereof, respectively.

Exemplary linking moieties include a hydrocarbon moiety or chain, optionally interrupted by one or more heteroatoms, as defined herein, and/or any of the chemical groups listed below, when defined as linking groups.

When a chemical group is referred to herein as "end group" it is to be interpreted as a substituent, which is connected to another group via one atom thereof.

Herein throughout, the term "hydrocarbon" collectively describes a chemical group composed mainly of carbon and hydrogen atoms. A hydrocarbon can be comprised of alkyl, alkene, alkyne, aryl, and/or cycloalkyl, each can be substituted or unsubstituted, and can be interrupted by one or more heteroatoms. The number of carbon atoms can range from 2 to 20, and is preferably lower, e.g., from 1 to 10, or from 1 to 6, or from 1 to 4. A hydrocarbon can be a linking group or an end group.

As used herein, the term "amine" describes both a -NRxRy group and a -NRx-group, wherein Rx and Ry are each independently hydrogen, alkyl, cycloalkyl, aryl, as these terms are defined hereinbelow.

The amine group can therefore be a primary amine, where both Rx and Ry are hydrogen, a secondary amine, where Rx is hydrogen and Ry is alkyl, cycloalkyl or aryl, or a tertiary amine, where each of Rx and Ry is independently alkyl, cycloalkyl or aryl.

Alternatively, Rx and Ry can each independently be hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, carbonyl, C-carboxylate, O-carboxylate, N-thiocarbamate, O-thiocarbamate, urea, thiourea, N-carbamate, O-carbamate, C-amide, N-amide, guanyl, guanidine and hydrazine.

The term "amine" is used herein to describe a -NRxRy group in cases where the amine is an end group, as defined hereinunder, and is used herein to describe a -NRx-group in cases where the amine is a linking group or is or part of a linking moiety.

The term "alkyl" describes a saturated aliphatic hydrocarbon including straight chain and branched chain groups. Preferably, the alkyl group has 1 to 20 carbon atoms. Whenever a numerical range; e.g., "1-20", is stated herein, it implies that the group, in this case the alkyl group, may contain 1 carbon atom, 2 carbon atoms, 3 carbon atoms, etc., up to and including 20 carbon atoms. More preferably, the alkyl is a medium size alkyl having 1 to 10 carbon atoms. Most preferably, unless otherwise indicated, the alkyl is a lower alkyl having 1 to 4 carbon atoms (C(1-4) alkyl). The alkyl group may be substituted or unsubstituted. Substituted alkyl may have one or more substituents, whereby each substituent group can independently be, for example, hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, N-carbamate, O-carbamate, C-amide, N-amide, guanyl, guanidine and hydrazine.

The alkyl group can be an end group, as this phrase is defined hereinabove, wherein it is attached to a single adjacent atom, or a linking group, as this phrase is defined hereinabove, which connects two or more moieties via at least two carbons in its chain. When the alkyl is a linking group, it is also referred to herein as "alkylene" or "alkylene chain".

Alkene and alkyne, as used herein, are an alkyl, as defined herein, which contains one or more double bond or triple bond, respectively.

The term "cycloalkyl" describes an all-carbon monocyclic ring or fused rings (i.e., rings which share an adjacent pair of carbon atoms) group where one or more of the rings does not have a completely conjugated pi-electron system. Examples include, without limitation, cyclohexane, adamantine, norbornyl, isobornyl, and the like. The cycloalkyl group may be substituted or unsubstituted. Substituted cycloalkyl may have one or more substituents, whereby each substituent group can independently be, for example, hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, N-carbamate, O-carbamate, C-amide, N-amide, guanyl, guanidine and hydrazine. The cycloalkyl group can be an end group, as this phrase is defined hereinabove, wherein it is attached to a single adjacent atom, or a linking group, as this phrase is defined hereinabove, connecting two or more moieties at two or more positions thereof.

The term "heteroalicyclic" describes a monocyclic or fused ring group having in the ring(s) one or more atoms such as nitrogen, oxygen and sulfur. The rings may also have one or more double bonds. However, the rings do not have a completely conjugated pi-electron system. Representative examples are piperidine, piperazine, tetrahydrofuran, tetrahydropyrane, morpholino, oxalidine, and the like. The heteroalicyclic may be substituted or unsubstituted. Substituted heteroalicyclic may have one or more substituents, whereby each substituent group can independently be, for example, hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, O-carbamate, N-carbamate, C-amide, N-amide, guanyl, guanidine and hydrazine. The heteroalicyclic group can be an end group, as this phrase is defined hereinabove, where it is attached to a single adjacent atom, or a linking group, as this phrase is defined hereinabove, connecting two or more moieties at two or more positions thereof.

The term "aryl" describes an all-carbon monocyclic or fused-ring polycyclic (i.e., rings which share adjacent pairs of carbon atoms) groups having a completely conjugated pi-electron system. The aryl group may be substituted or unsubstituted. Substituted aryl may have one or more substituents, whereby each substituent group can independently be, for example, hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, N-carbamate, O-carbamate, C-amide, N-amide, guanyl, guanidine and hydrazine. The aryl group can be an end group, as this term is defined hereinabove, wherein it is attached to a single adjacent atom, or a linking group, as this term is defined hereinabove, connecting two or more moieties at two or more positions thereof.

The term "heteroaryl" describes a monocyclic or fused ring (i.e., rings which share an adjacent pair of atoms) group having in the ring(s) one or more atoms, such as, for example, nitrogen, oxygen and sulfur and, in addition, having a completely conjugated pi-electron system. Examples, without limitation, of heteroaryl groups include pyrrole, furan, thiophene, imidazole, oxazole, thiazole, pyrazole, pyridine, pyrimidine, quinoline, isoquinoline and purine. The heteroaryl group may be substituted or unsubstituted. Substituted heteroaryl may have one or more substituents, whereby each substituent group can independently be, for example, hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, O-carbamate, N-carbamate, C-amide, N-amide, guanyl, guanidine and hydrazine. The heteroaryl group can be an end group, as this phrase is defined hereinabove, where it is attached to a single adjacent atom, or a linking group, as this phrase is defined hereinabove, connecting two or more moieties at two or more positions thereof. Representative examples are pyridine, pyrrole, oxazole, indole, purine and the like.

The term "halide" and "halo" describes fluorine, chlorine, bromine or iodine.

The term "haloalkyl" describes an alkyl group as defined above, further substituted by one or more halide.

The term "sulfate" describes a —O—S(=O)$_2$-ORx end group, as this term is defined hereinabove, or an —O—S(=O)$_2$—O— linking group, as these phrases are defined hereinabove, where Rx is as defined hereinabove.

The term "thiosulfate" describes a —O—S(=S)(=O)-ORx end group or a —O—S(=S)(=O)—O— linking group, as these phrases are defined hereinabove, where Rx is as defined hereinabove.

The term "sulfite" describes an —O—S(=O)—O-Rx end group or a —O—S(=O)—O— group linking group, as these phrases are defined hereinabove, where Rx' is as defined hereinabove.

The term "thiosulfite" describes a —O—S(=S)—O-Rx end group or an —O—S(=S)—O— group linking group, as these phrases are defined hereinabove, where Rx is as defined hereinabove.

The term "sulfinate" describes a —S(=O)—ORx end group or an —S(=O)—O— group linking group, as these phrases are defined hereinabove, where Rx is as defined hereinabove.

The term "sulfoxide" or "sulfinyl" describes a —S(=O)Rx end group or an —S(=O)— linking group, as these phrases are defined hereinabove, where Rx is as defined hereinabove.

The term "sulfonate" describes a —S(=O)$_2$-Rx end group or an —S(=O)$_2$— linking group, as these phrases are defined hereinabove, where Rx is as defined herein.

The term "S-sulfonamide" describes a —S(=O)$_2$-NRxRy end group or a —S(=O)$_2$-NRx- linking group, as these phrases are defined hereinabove, with Rx and Ry as defined herein.

The term "N-sulfonamide" describes an RxS(=O)$_2$-NRy- end group or a —S(=O)$_2$-NRx- linking group, as these phrases are defined hereinabove, where Rx and Ry are as defined herein.

The term "disulfide" refers to a —S-SRx end group or a —S—S— linking group, as these phrases are defined hereinabove, where Rx is as defined herein.

The term "phosphonate" describes a —P(=O)(ORx)(ORy) end group or a —P(=O)(ORx)(O)— linking group, as these phrases are defined hereinabove, with Rx and Ry as defined herein.

The term "thiophosphonate" describes a —P(=S)(ORx)(ORy) end group or a —P(=S)(ORx)(O)— linking group, as these phrases are defined hereinabove, with Rx and Ry as defined herein.

The term "phosphinyl" describes a -PRxRy end group or a -PRx- linking group, as these phrases are defined hereinabove, with Rx and Ry as defined hereinabove.

The term "phosphine oxide" describes a —P(=O)(Rx)(Ry) end group or a —P(=O)(Rx)- linking group, as these phrases are defined hereinabove, with Rx and Ry as defined herein.

The term "phosphine sulfide" describes a —P(=S)(Rx)(Ry) end group or a —P(=S)(Rx)- linking group, as these phrases are defined hereinabove, with Rx and Ry as defined herein.

The term "phosphite" describes an —O-PRx(=O)(ORy) end group or an —O-PRx(=O)(O)— linking group, as these phrases are defined hereinabove, with Rx and Ry as defined herein.

The term "carbonyl" or "carbonate" as used herein, describes a —C(=O)-Rx end group or a —C(=O)— linking group, as these phrases are defined hereinabove, with Rx as defined herein.

The term "thiocarbonyl" as used herein, describes a —C(=S)-Rx end group or a —C(=S)— linking group, as these phrases are defined hereinabove, with Rx as defined herein.

The term "oxo" as used herein, describes a (=O) group, wherein an oxygen atom is linked by a double bond to the atom (e.g., carbon atom) at the indicated position.

The term "thiooxo" as used herein, describes a (=S) group, wherein a sulfur atom is linked by a double bond to the atom (e.g., carbon atom) at the indicated position.

The term "oxime" describes a =N—OH end group or a =N—O— linking group, as these phrases are defined hereinabove.

The term "hydroxyl" describes a —OH group.

The term "alkoxy" describes both an —O-alkyl and an —O-cycloalkyl group, as defined herein.

The term "aryloxy" describes both an —O-aryl and an —O-heteroaryl group, as defined herein.

The term "thiohydroxy" describes a —SH group.

The term "thioalkoxy" describes both a —S-alkyl group, and a —S-cycloalkyl group, as defined herein.

The term "thioaryloxy" describes both a —S-aryl and a —S-heteroaryl group, as defined herein.

The "hydroxyalkyl" is also referred to herein as "alcohol", and describes an alkyl, as defined herein, substituted by a hydroxy group.

The term "cyano" describes a —C≡N group.

The term "isocyanate" describes an —N=C=O group.

The term "isothiocyanate" describes an —N=C=S group.

The term "nitro" describes an —NO$_2$ group.

The term "acyl halide" describes a —(C=O)Rz group wherein Rz is halide, as defined hereinabove.

The term "azo" or "diazo" describes an —N=NRx end group or an —N=N— linking group, as these phrases are defined hereinabove, with Rx as defined hereinabove.

The term "peroxo" describes an —O-ORx end group or an —O—O— linking group, as these phrases are defined hereinabove, with Rx as defined hereinabove.

The term "carboxylate" as used herein encompasses C-carboxylate and O-carboxylate.

The term "C-carboxylate" describes a —C(=O)—ORx end group or a —C(=O)—O— linking group, as these phrases are defined hereinabove, where Rx is as defined herein.

The term "O-carboxylate" describes a —OC(=O)Rx end group or a —OC(=O)— linking group, as these phrases are defined hereinabove, where Rx is as defined herein.

A carboxylate can be linear or cyclic. When cyclic, Rx and the carbon atom are linked together to form a ring, in C-carboxylate, and this group is also referred to as lactone. Alternatively, Rx and O are linked together to form a ring in O-carboxylate. Cyclic carboxylates can function as a linking group, for example, when an atom in the formed ring is linked to another group.

The term "thiocarboxylate" as used herein encompasses C-thiocarboxylate and O-thiocarboxylate.

The term "C-thiocarboxylate" describes a —C(=S)—ORx end group or a —C(=S)—O— linking group, as these phrases are defined hereinabove, where Rx is as defined herein.

The term "O-thiocarboxylate" describes a —OC(=S)Rx end group or a —OC(=S)— linking group, as these phrases are defined hereinabove, where Rx is as defined herein.

A thiocarboxylate can be linear or cyclic. When cyclic, Rx and the carbon atom are linked together to form a ring, in C-thiocarboxylate, and this group is also referred to as thiolactone. Alternatively, Rx and O are linked together to form a ring in O-thiocarboxylate. Cyclic thiocarboxylates can function as a linking group, for example, when an atom in the formed ring is linked to another group.

The term "carbamate" as used herein encompasses N-carbamate and O-carbamate.

The term "N-carbamate" describes an RyOC(=O)-NRx- end group or a —OC(=O)-NRx- linking group, as these phrases are defined hereinabove, with Rx and Ry as defined herein.

The term "O-carbamate" describes an —OC(=O)-NRxRy end group or an —OC(=O)-NRx- linking group, as these phrases are defined hereinabove, with Rx and Ry as defined herein.

A carbamate can be linear or cyclic. When cyclic, Rx and the carbon atom are linked together to form a ring, in O-carbamate. Alternatively, Rx and O are linked together to form a ring in N-carbamate. Cyclic carbamates can function as a linking group, for example, when an atom in the formed ring is linked to another group.

The term "carbamate" as used herein encompasses N-carbamate and O-carbamate.

The term "thiocarbamate" as used herein encompasses N-thiocarbamate and O-thiocarbamate.

The term "O-thiocarbamate" describes a —OC(=S)-NRxRy end group or a —OC(=S)-NRx- linking group, as these phrases are defined hereinabove, with Rx and Ry as defined herein.

The term "N-thiocarbamate" describes an RyOC(=S)NRx- end group or a —OC(=S)NRx- linking group, as these phrases are defined hereinabove, with Rx and Ry as defined herein.

Thiocarbamates can be linear or cyclic, as described herein for carbamates.

The term "dithiocarbamate" as used herein encompasses S-dithiocarbamate and N-dithiocarbamate.

The term "S-dithiocarbamate" describes a —SC(=S)-NRxRy end group or a —SC(=S)NRx- linking group, as these phrases are defined hereinabove, with Rx and Ry as defined herein.

The term "N-dithiocarbamate" describes an RySC(=S)NRx- end group or a —SC(=S)NRx- linking group, as these phrases are defined hereinabove, with Rx and Ry as defined herein.

The term "urea", which is also referred to herein as "ureido", describes a -NRxC(=O)-NRyRq end group or a -NRxC(=O)-NRy- linking group, as these phrases are defined hereinabove, where Rz and Ry are as defined herein and Rq is as defined herein for Rx and Ry.

The term "thiourea", which is also referred to herein as "thioureido", describes a -NRx-C(=S)-NRyRq end group or a -NRx-C(=S)-NRy- linking group, with Rx, Ry and Rq as defined herein.

The term "amide" as used herein encompasses C-amide and N-amide.

The term "C-amide" describes a —C(=O)-NRxRy end group or a —C(=O)-NRx- linking group, as these phrases are defined hereinabove, where Rx and Ry are as defined herein.

The term "N-amide" describes a RxC(=O)-NRy- end group or a RxC(=O)—N— linking group, as these phrases are defined hereinabove, where Rx and Ry are as defined herein.

An amide can be linear or cyclic. When cyclic, Rx and the carbon atom are linked together to form a ring, in C-amide, and this group is also referred to as lactam. Cyclic amides can function as a linking group, for example, when an atom in the formed ring is linked to another group.

The term "guanyl" describes a RxRyNC(=N)— end group or a -RxNC(=N)— linking group, as these phrases are defined hereinabove, where Rx and Ry are as defined herein.

The term "guanidine" describes a -RxNC(=N)-NRyRq end group or a -RxNC(=N)-NRy- linking group, as these phrases are defined hereinabove, where Rx, Ry and Rq are as defined herein.

The term "hydrazine" describes a -NRx-NRyRq end group or a -NRx-NRy- linking group, as these phrases are defined hereinabove, with Rx, Ry, and Rq as defined herein.

As used herein, the term "hydrazide" describes a —C(=O)-NRx-NRyRq end group or a —C(=O)-NRx-NRy- linking group, as these phrases are defined hereinabove, where Rx, Ry and Rq are as defined herein.

As used herein, the term "thiohydrazide" describes a —C(=S)-NRx-NRyRq end group or a —C(=S)-NRx- NRy- linking group, as these phrases are defined hereinabove, where Rx, Ry and Rq are as defined herein.

As used herein, the term "alkylene glycol" describes a —O—[(CRxRy)$_z$—O]$_y$-Rq end group or a —O—[(CRxRy)$_z$—O]$_y$— linking group, with Rx, Ry and Rq being as defined herein, and with z being an integer of from 1 to 10, preferably, 2-6, more preferably 2 or 3, and y being an integer of 1 or more. Preferably Rx and Ry are both hydrogen. When z is 2 and y is 1, this group is ethylene glycol. When z is 3 and y is 1, this group is propylene glycol.

When y is greater than 4, the alkylene glycol is referred to herein as poly(alkylene glycol). In some embodiments of the present invention, a poly(alkylene glycol) group or moiety can have from 10 to 200 repeating alkylene glycol units, such that z is 10 to 200, preferably 10-100, more preferably 10-50.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

EXAMPLE 1

Exemplary commercially available materials usable in soluble support technologies for AM processes such as 3D inkjet printing may comprise non-curable (non-reactive) polymeric materials such as polyols (e.g., glycols), and a mixture of mono-functional and di-functional curable monomers or oligomers.

Exemplary mono-functional curable materials (curable monomers, oligomers or polymers) are poly(alkylene glycol) acrylates such as, but not limited to, PEG monoacrylate reagents such as SR-256, SR-410 SR-550, marketed by SARTOMER company, PEG methacrylate reagents such as Bisomer® MPEG350MA, Bisomer® and PEM6 LD, marketed by GEO®), and PPG acrylate reagents such as Bisomer® PPA6 marketed by GEO.

These exemplary mono-functional materials can be collectively represented by the following general Formula IV:

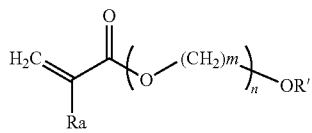

Formula IV wherein:

n is an integer ranging from 2 to 10, or from 2 to 8;

m is an integer ranging from 2 to 6, preferably from 2 to 4, or is 2 or 3;

R' can be hydrogen, alkyl, cycloalkyl, or aryl; and

Ra is H or C(1-4) alkyl.

Exemplary di-functional curable materials (curable monomers, oligomers or polymers) include di-functional poly(alkylene glycol) diacrylates, which can be represented by the following general Formula V:

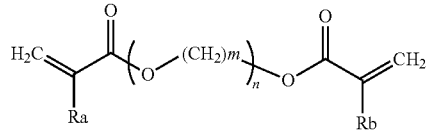

Formula V wherein:

n is an integer ranging from 2 to 40, or from 2 to 20, or from 2 to 10, or from 2 to 8;

m is an integer ranging from 2 to 6, preferably from 2 to 4, or is 2 or 3; and

Ra and Rb are each independently H or C(1-4) alkyl.

When a di-functional curable material is present in a support material formulation, it may act as a chemical cross-linking agent which covalently links two or more polymeric chains formed upon curing the curable materials. As a result, the cured support material comprises cross-linked polymeric chains, and hence a certain degree of chemical cross-linking, depending on the concentration and type of the di-functional curable material.

The presence of chemically cross-linked polymeric chains in a cured support material is assumed to provide the cured support material with the desired mechanical strength, yet, it also adversely affects the dissolution of the cured support material in an aqueous solution.

For example, a support material formulation which comprises a mixture of a poly(alkylene glycol) monoacrylate and a poly(alkylene glycol) diacrylate, as described herein, at a ratio that ranges, for example, from 70:30 to 95:5, by weight, at a total concentration of the curable monomers of 35-40% by weight (e.g., 38.1% by weight), is non-soluble in water and is typically dissolvable in a concentrated alkaline solution, for example a 5% NaOH solution, yet, the dissolution rate is relatively low and a dissolution time is high. For example, a complete dissolution of a 16-gram (20×20×20 mm) cube printed using such a support material formulation immersed in a 800 mL of cleaning solution of 2% Sodium Hydroxide and 1% Sodium Metasilicate, under continuous stirring, was observed after 11 hours. In addition, a saturation of the cleaning solution is observed already when 5% by weight of a dissolved soluble material are present in the solution.

In an attempt to increase the dissolution rate of support material formulations comprising a mixture of mono-functional and di-functional curable monomers (e.g., acrylate monomers), as described herein, the present inventors have studied the effect of reducing the total concentration of the curable monomers in a soluble support formulation.

To this effect, three formulations, denoted herein F1, F2 and F3, were prepared with varying total concentrations of a mixture of mono-functional and di-functional poly(alkylene glycol) acrylate monomers (hereinafter referred to as "poly(alkylene glycol) acrylate mixture", as follows: F1—38.1% by weight poly(alkylene glycol) acrylate mixture; F2—26.7% by weight poly(alkylene glycol) acrylate mixture; and F3—21.7% by weight poly(alkylene glycol) acrylate mixture. The weight ratio of the mono-functional acrylate to di-functional acrylate in each of the formulations was about 90:10.

Each formulation contained, in addition to the poly(alkylene glycol) acrylate mixture at the above-indicated concentrations, a non-curable polyol, at a concentration of 30-80 weight percents, a photoinitiator (e.g., of the BAPO type), at a concentration of 0.1-2 weight percents, an inhibitor at a concentration of 0.1-2 weight percents, and a surfactant, at a concentration of 0.1-2 weight percents.

A 16-gram (20 mm×20 mm×20 mm) cube printed (by 3D inkjet printing as described herein) using such a support material formulation, and cured, was immersed in an 800 mL of a cleaning solution of 2% wt. Sodium Hydroxide and 1% wt. Sodium Metasilicate. As shown in FIG. 1, reducing the concentration of the poly(alkylene glycol) acrylate mixture by about 30% (from 38.1% wt. in F1 to 26.7% wt. in F2) resulted in about 2-fold decrease in the dissolution time, and decreasing the concentration of the poly(alkylene glycol) acrylate mixture by about 43% (from 38.1% wt. in F1 to 21.7% wt. in F3) resulted in more than 4.5-fold decrease in the dissolution time.

In order to determine the effect of reducing the concentration of the poly(alkylene glycol) acrylate mixture in the support material formulation, the mechanical strength of the objects printed from F1, F2 and F3 was determined.

Mechanical strength was determined by compression tests performed using LLOYD tensiometer model LR5K PLUS, operated at standard Compression set parameters, and is expressed by N, with respect to the above-mentioned cube.

Figure 2:
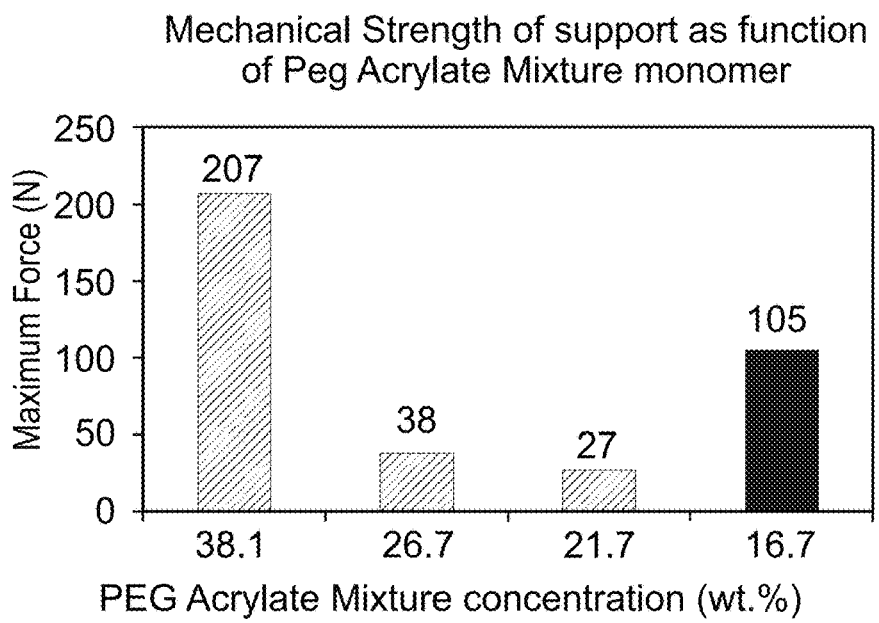
FIG. 2 is a bar graph presenting the mechanical strength measured for a printed 16-grams cube formed of a support material formulation comprising an exemplary first curable material as described herein, as a function of the concentration of the first curable material (dashed bars) and of the same cube formed of a support material formulation in which 10% of an exemplary second curable material (HAA) were added to the first curable material (black bar)

The results are presented in FIG. 2, and show a drastic decrease in the mechanical strength of the cured support formulations as a result of reducing the concentration of the poly(alkylene glycol) acrylate mixture. These results further show that 26.7% wt. of the poly(alkylene glycol) acrylate mixture is the lowest limit of the poly(alkylene glycol) acrylate mixture's concentration that provides a sufficient mechanical strength of the cured support material to support the model in certain (e.g. PolyJet) 3D printing systems.

Without being bound by any particular theory, the present inventors have assumed that the relatively high dissolution time of poly(alkylene glycol) acrylate mixture-containing formulations is attributed to intermolecular interactions between the polymeric chains formed upon curing the formulation, presumably chemical cross-linking effected by a di-functional acrylate monomer.

In a search for novel support material formulations that would exhibit improved dissolution time without compromising the mechanical properties of the cured support material, the present inventors have conceived replacing at least a part of the monomers in the poly(alkylene glycol) acrylate mixture by a curable monomer that may interfere with the intermolecular interactions (e.g., chemical cross-linking) between polymeric chains formed upon curing.

The present inventors have conceived that such a curable monomer should be capable of forming polymeric chains that interact with other polymeric chains in the cured support material via non-covalent interactions, for example, via hydrogen bonds. Thus, such a curable monomer should exhibit at least two chemical moieties that can participate in hydrogen bond interactions, as this term is defined herein. Such chemical moieties are also referred to herein as "hydrogen-bond forming chemical moieties".

The present inventors have therefore designed a novel formulation, termed herein "F4", which comprises 16.7% wt. of the poly(alkylene glycol) acrylate mixture and 10% wt. a water-soluble acryl amide that features one hydrogen-bond forming chemical moiety by means of the amide group, and an additional bond-forming chemical moiety, by means of a substituent of the amide, whereby all other ingredients are the same as in formulations F1, F2 and F3.

An exemplary such an acrylamide compound can be presented by the following formula I:

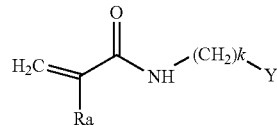

Formula I wherein Ra is hydrogen or C(1-4) alkyl;

k is an integer of from 2-10, or from 2-8, or from 2-6, or from 2-4, or is 2 or 3; and Y is a hydrogen bond-forming chemical moiety, for example, a moiety that contains oxygen or nitrogen (e.g., hydroxyl, amine, alkylamine, dialkyl amine, and the like), as described herein.

As shown in FIG. 1, the dissolution time of a cured support material printed with exemplary formulation F4, compared to F2, decreased drastically, by more than 3-folds.

Surprisingly, as shown in FIG. 2, the mechanical strength of the cured support material was almost 3-folds higher for F4, compared to F2, and was in line with the requirements of a support material in (e.g., PolyJet) 3D printing systems.

The improved dissolution time exhibited by the F4 formulation was demonstrated in further studies.

Formulations F1, F2, F3 and F4 were used to print various shapes, namely, Brain Gear (BG), Lego and Small Flute. Upon curing, the printed objects were subjected to dissolution by a 5% NaOH solution, in a Jig cleaning system.

Figure 3:
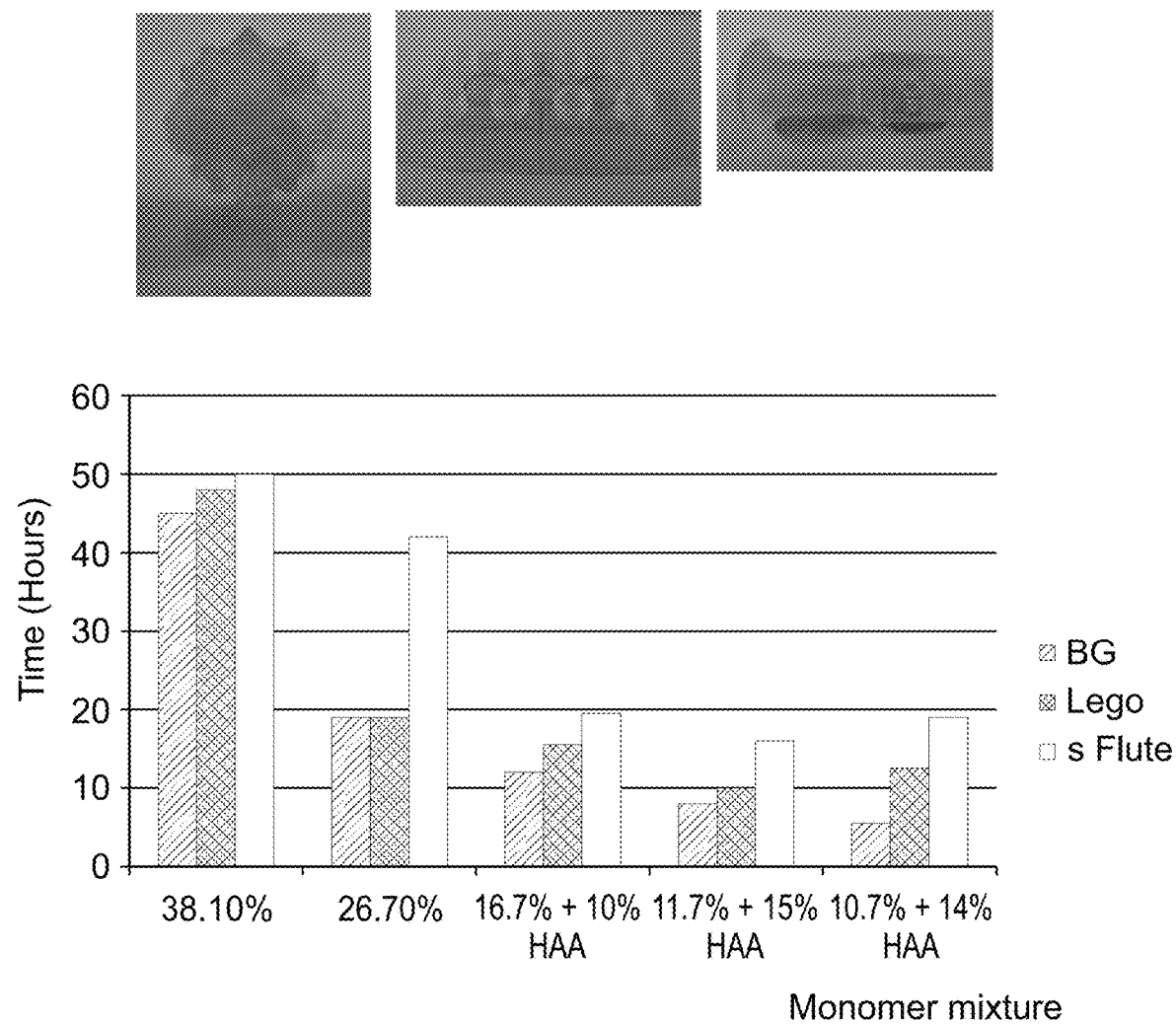
FIG. 3 is a bar graph presenting the dissolution time, in an exemplary alkaline solution as described herein, of various model objects formed with a support material formulation comprising an exemplary first curable material as described herein, as a function of the concentration of the first curable material and of the same cube formed of a support material formulation in which various concentrations of an exemplary second curable material (HAA) were added to the first curable material (the shape of the model objects shown in the insets)

The results are presented in FIG. 3. It can be seen that reducing the concentration of the poly(alkylene glycol) acrylate mixture from 38.1% wt. (F1) to 26.7% wt. (F2), the dissolution time decreased by 2-folds for BG and Lego parts. By decreasing the concentration of the poly(alkylene glycol) acrylate mixture below 26.7% wt. and adding the acrylamide monomer to a total monomer concentration of 26.7% wt. of the poly(alkylene glycol) acrylate mixture and the additional acrylamide monomer (F4) the dissolution time decreased by about 4-folds compared to F1, for the Lego part, and by about 10-folds for the BG part, compared to F1.

In addition, the cured support material prepared from the F4 formulation was shown to be soft enough to allow mechanical breakability, such that a substantial amount of the cured support material can be readily removed by mild mechanical means, and may circumvent the need to use chemical dissolution.

In additional experiments, a mixture of two acrylamide monomers that feature one hydrogen bond-forming chemical moiety as the amide and one hydrogen bond-forming chemical moiety as a substituent of the amide, was tested.

In these experiments, an acrylamide monomer as described herein, that features a relatively high Tg (e.g., higher than 120° C., or higher than 130° C., e.g., 135° C.) was added to the support material formulation.

The additional acrylamide monomer was selected as such that forms a rigid, hard, thermal-resistant, water-soluble solid polymer that exhibits a dissolution time in water which is much lower than the dissolution time of other High Tg-monomers.

Formulation F5 contains 16.7% wt. of the poly(alkylene glycol) acrylate mixture, 5% wt. of an acrylamide monomer used in F4 and 5% wt. an additional acrylamide monomer featuring high Tg and low dissolution time in water, with all other ingredients being the same as in F1-F4. Dissolution time and mechanical strength were determined as described for F1-F4 (FIGS. 1 and 2) in Example 1 hereinabove.

Figure 4:
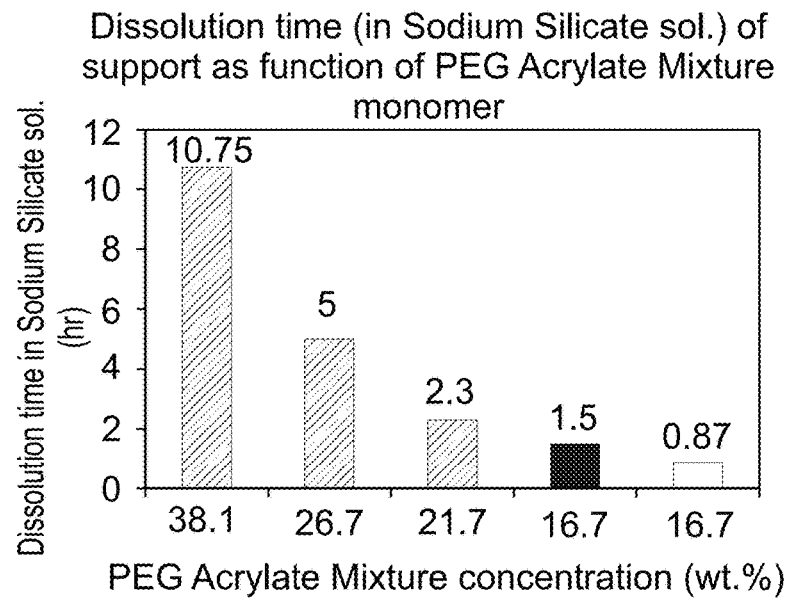
FIG. 4 is a bar graph presenting the mechanical strength measured for a printed 16-grams cube formed of a support material formulation comprising an exemplary first curable material as described herein, as a function of the concentration of the first curable material (dashed bars), of the same cube formed of a support material formulation in which 10% of an exemplary second curable material (HAA) were added to the first curable material (black bar), and of the same cube formed of a support material formulation in which a mixture of 5% of an exemplary second curable material (HAA) and 5% of another exemplary second curable material was added to the first curable material (blank bar)

As shown in FIG. 4, the dissolution time of a cured support material printed from formulation F5 was 2-folds lower than that of F4.

Figure 5:
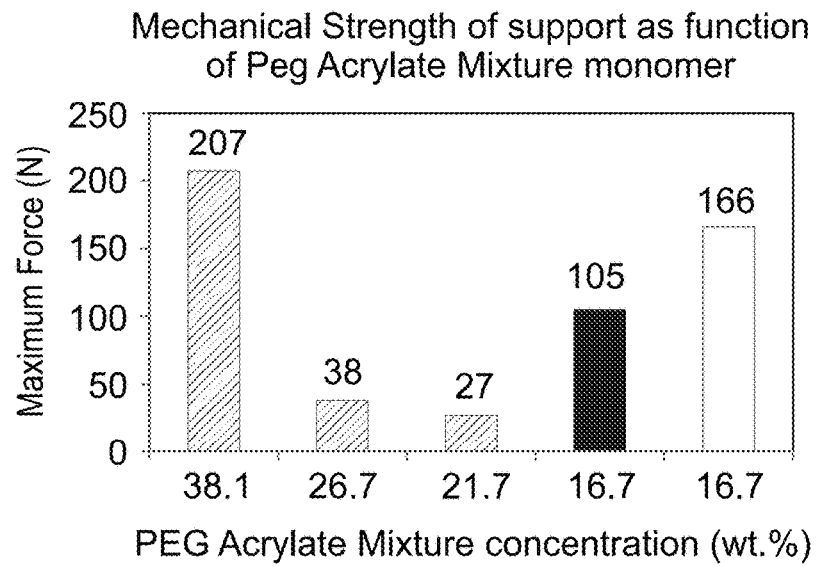
FIG. 5 is a bar graph presenting the mechanical strength measured for a printed 16-grams cube formed of a support material formulation comprising an exemplary first curable material as described herein, as a function of the concentration of the first curable material (dashed bars), of the same cube formed of a support material formulation in which 10% of an exemplary second curable material (HAA) were added to the first curable material (black bar), and of the same cube formed of a support material formulation in which a mixture of 5% of an exemplary second curable material (HAA) and 5% of another exemplary second curable material was added to the first curable material (blank bar)

As shown in FIG. 5, the mechanical strength of the cured support material increased by about 50%, compared to F4.

In order to verify that the hydrogen bond formation attributed to tested acrylamide compounds described above indeed accounts for the improved performance of support material formulations containing same, a formulation containing isobornyl acrylate (IBOA) was tested.

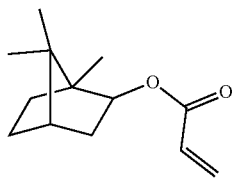

Isobornyl acrylate (IBOA)

IBOA is a high Tg-monomer that does not feature two groups that are capable of forming hydrogen bonds.

30 grams of the F4 formulation as described herein and 30 grams of a similar formulation in which the acrylamide monomer was replaced by an equivalent amount of IBOA, were put in mold and cured in a UV oven for 5 hours.

The mechanical strength of each of the cured formulations was measured in LLOYD Tensiometer (compression set), as described herein.

Figure 6:
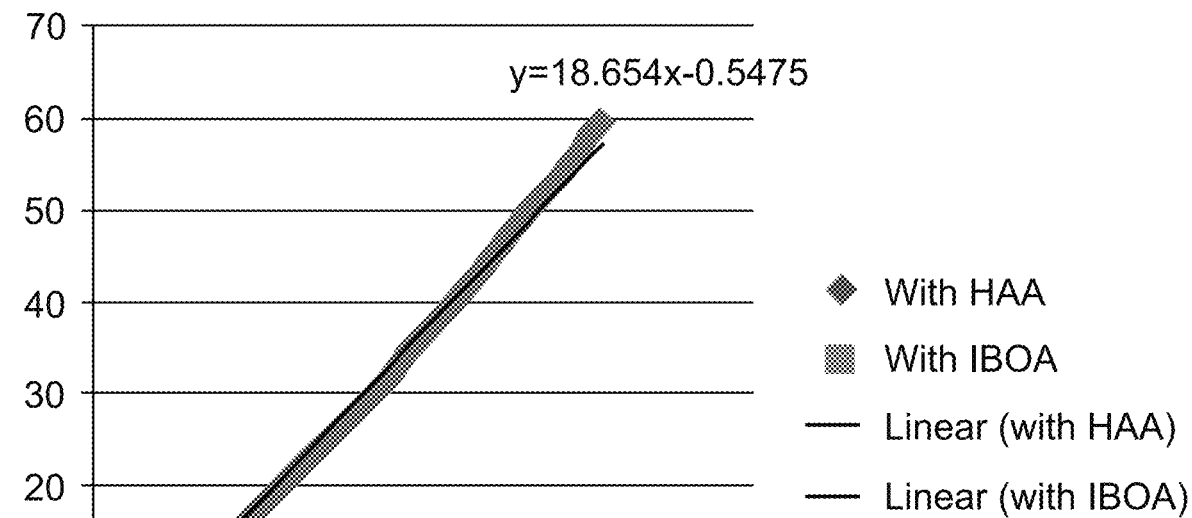
FIG. 6 presents comparative plots showing the mechanical strength (N) as a function of deflection (M"M) measured for 30 grams of the F4 formulation as described herein and 30 grams of a similar formulation in which the acrylamide monomer was replaced by an equivalent amount of IBOA, which were put in mold and cured in a UV oven for 5 hours.

The obtained data is presented in FIG. 6 and clearly shows the substantially higher mechanical strength was exhibited by the F4 formulation.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

It is the intent of the applicant(s) that all publications, patents and patent applications referred to in this specification are to be incorporated in their entirety by reference into the specification, as if each individual publication, patent or patent application was specifically and individually noted when referenced that it is to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. A method of fabricating a three-dimensional model object, the method comprising dispensing a building material so as to sequentially form a plurality of layers in a configured pattern corresponding to the shape of the object, wherein said building material comprises a modeling material formulation and a support material formulation, and wherein said support material formulation comprises:
   a non-curable water-miscible polymer, in an amount that ranges from 30 to 80 weight percent of the total weight of the formulation, said non-curable water-miscible polymer comprising an alkoxylated polyol;
   a non-curable water-miscible non-polymeric material which comprises 1,2-propanediol;
   a first water-miscible, curable material in an amount that ranges from 10 to 20 weight percent of the total weight of the formulation; and
   at least one second water-miscible curable material in an amount that ranges from 5 to 15 weight percent of the total weight of the formulation,
   wherein said first water-miscible curable material comprises a mono-functional poly(alkylene glycol) acrylate; and
   wherein said second water-miscible curable material is represented by Formula I:

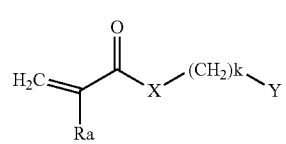

Formula I wherein:
Ra is selected from H, C(1-4) alkyl and a hydrophilic group;
k is an integer ranging from 2 to 10;
X is -NRc-, wherein Rc is hydrogen, alkyl, cycloalkyl or aryl; and
Y is a hydrogen bond-forming moiety that comprises at least one nitrogen and/or oxygen atom,
the support material formulation being devoid of a multi-functional curable material.

2. The method of claim 1, wherein said second water-miscible curable material is an acrylamide substituted by said hydrogen bond-forming moiety.

3. The method of claim 1, wherein Y is selected from hydroxyl, alkoxy, aryloxy, amine, alkylamine, dialkylamine, carboxylate, hydrazine, carbamate, hydrazine, a nitrogen-containing heteralicyclic, and an oxygen-containing heteralicyclic.

4. The method of claim 1, wherein Ra is H, such that the second curable material is an acrylamide.

5. The method of claim 1, wherein said water-miscible polymer comprises said alkoxylated polyol and a polyethylene glycol.

6. The method of claim 1, wherein a concentration of said second water-miscible curable material ranges from 5 to 10 weight percent of the total weight of the support material formulation.

7. The method of claim 1, wherein said support material formulation further comprises an initiator, a surface active agent and/or an inhibitor.

8. The method of claim 1, wherein each of said first and second water-miscible curable materials is a UV-curable material.

9. The method of claim 1, further comprising, subsequent to said dispensing, exposing the building material to curing energy, to thereby obtain a printed objected comprised of a cured modeling material and a cured support material.

10. The method of claim 9, wherein said cured support material is characterized by a mechanical strength that is lower than a mechanical strength of a cured support material made of a comparable support material formulation that is absent said second water-miscible curable material and comprises substantially the same total concentration of curable materials as the formulation, by no more than 50% or by no more than 40%, or by no more than 30%.

11. The method of claim 9, further comprising removing said cured support material, to thereby obtain the three-dimensional model object.

12. The method of claim 11, wherein said removing comprises contacting said cured support material with a cleaning solution.

13. The method of claim 12, wherein said cleaning solution comprises an alkali metal hydroxide.

14. The method of claim 13, wherein said cleaning solution further comprises an alkali metal silicate.

15. The method of claim 14, wherein said cleaning solution comprises an alkali metal silicate at a concentration that ranges from 1 to 3 weight percent of the total weight of the solution, and an alkali metal hydroxide at a concentration that ranges from 1 to 3 weight percent of the total weight of the solution.

16. The method of claim 15, wherein a concentration of said alkali metal hydroxide is 2 weight percent of the total weight of the solution and a concentration of said sodium metasilicate is 1 weight percent.

17. The method of claim 12, wherein said contacting is during a time period that is shorter by at least 20% than a time period required to remove a cured support material made of a comparable support material formulation that is absent said second water-miscible curable material.

18. The method of claim 12, wherein said contacting is effected without replacing the cleaning composition.

* * * * *